(12) United States Patent
Tsujiko et al.

(10) Patent No.: US 8,742,725 B2
(45) Date of Patent: Jun. 3, 2014

(54) SECONDARY BATTERY SYSTEM

(75) Inventors: Akira Tsujiko, Miyoshi (JP); Tomitaro Hara, Okazaki (JP); Takuichi Arai, Toyota (JP); Tsuyoshi Yano, Toyota (JP); Daisuke Teramoto, Toyota (JP); Keiko Wasada, Toyota (JP); Sachie Yuasa, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 550 days.

(21) Appl. No.: 12/934,141

(22) PCT Filed: Mar. 26, 2009

(86) PCT No.: PCT/JP2009/056052
§ 371 (c)(1),
(2), (4) Date: Sep. 23, 2010

(87) PCT Pub. No.: WO2009/122991
PCT Pub. Date: Oct. 8, 2009

(65) Prior Publication Data
US 2011/0012604 A1   Jan. 20, 2011

(30) Foreign Application Priority Data
Apr. 1, 2008 (JP) ................. 2008-095413

(51) Int. Cl.
*H02J 7/00* (2006.01)

(52) U.S. Cl.
USPC .............. 320/132; 320/134; 320/148

(58) Field of Classification Search
USPC .......... 324/427; 320/132, 134, 148, 156, 161; 429/221, 231.8, 231.95
See application file for complete search history.

(56) References Cited

U.S. PATENT DOCUMENTS

| | | | |
|---|---|---|---|
| 2002/0195999 A1 | 12/2002 | Kimura et al. | |
| 2003/0222619 A1 | 12/2003 | Formenti et al. | |
| 2003/0222620 A1 | 12/2003 | Formenti et al. | |
| 2006/0158155 A1* | 7/2006 | Tamezane et al. | 320/132 |
| 2006/0208701 A1* | 9/2006 | Mikhaylik | 320/128 |

FOREIGN PATENT DOCUMENTS

| | | |
|---|---|---|
| EP | 1 271 171 | 1/2003 |
| EP | 1 367 688 A1 | 12/2003 |
| JP | 7-294611 | 11/1995 |

(Continued)

OTHER PUBLICATIONS

International Search Report in International Application No. PCT/JP2009/056052; Mailing date: Jun. 9, 2009.

(Continued)

*Primary Examiner* — Edward Tso
*Assistant Examiner* — Aaron Piggush
(74) *Attorney, Agent, or Firm* — Finnegan, Henderson, Farabow, Garrett & Dunner, LLP

(57) ABSTRACT

Provided is a secondary battery system which can accurately detect a state of a secondary battery system (such as a secondary battery state and a secondary battery system failure). The secondary battery system (6) includes dV/dQ calculation means which calculates a dV/dQ value as a ratio of a change amount dV of a battery voltage V of a secondary battery (100) against a change amount dQ of an accumulation amount Q when the accumulation amount Q of the secondary battery (100) is changed. The secondary battery system (6) detects the state of the secondary battery system (6) by using the dV/dQ value.

12 Claims, 22 Drawing Sheets

(56) References Cited

FOREIGN PATENT DOCUMENTS

| | | |
|---|---|---|
| JP | 9-68561 | 3/1997 |
| JP | 9-281202 | 10/1997 |
| JP | 11-346444 | 12/1999 |
| JP | 2001-33532 | 2/2001 |
| JP | 2003-36889 | 2/2003 |
| JP | 2003-45387 | 2/2003 |
| JP | 2003-86255 | 3/2003 |
| JP | 2004-7983 | 1/2004 |
| JP | 2007-134274 | 5/2007 |
| JP | 2007-292778 | 11/2007 |
| WO | WO 2007/145015 A1 | 12/2007 |
| WO | WO 2011/036760 | 3/2011 |

OTHER PUBLICATIONS

J. Shim et al., "Cycling Performance of Low-cost Lithium Ion Batteries with Natural Graphite and LiFePO$_4$," Journal of Power Sources, vols. 119-121, pp. 955-958 (2003).

Kumai et al., "Degradation Mechanism of Li-ion Cell after Long Cycling—Mechanism and Method for Estimating the Degradation Factor," Central Research Institute of Electric Power Industry Report, T01033, pp. 1-17 (Apr. 2002).

G. Fey et al., "Electrochemical Studies on Surface Coated LiCoVO$_4$ with Al$_2$O$_3$ Derived from Carboxylate-alumoxane for Lithium-ion Cells," Journal of Power Sources, Vo. 174, pp. 1152-1155 (2007).

I. Bloom et al., "Differential Voltage Analyses of High-power, Lithium-ion Cells, 1. Technique and Application," Journal of Power Sources, vol. 139, pp. 295-303 (2005).

I. Bloom et al., "Differential Voltage Analyses of High-power Lithium-ion Cells, 2. Applications," Journal of Power Sources, vol. 139, pp. 304-313 (2005).

I. Bloom et al., "Differential Voltage Analyses of High-power Lithium-ion Cells, 3. Another Anode Phenomenon," Journal of Power Sources, vol. 157, pp. 537-542 (2006).

Canadian Office Action for Appl. No. 2,720,136 dated Feb. 6, 2012.

Advanced Technology Development Program for Lithium-Ion Batteries: Gen 2 Performance Evaluation Final Report, Jul. 2006, pp. 26-34.

\* cited by examiner

SECONDARY BATTERY SYSTEM

CROSS-REFERENCE TO RELATED APPLICATIONS

This is a national phase application filed under 35 U.S.C. 371 of PCT/JP2009/056052 filed on Mar. 26, 2009, which claims the benefit of priority from the prior Japanese Patent Application No. 2008-095413 filed on Apr. 1, 2008, the entire contents of all of which are incorporated herein by reference.

TECHNICAL FIELD

The present invention relates to a secondary battery system.

BACKGROUND ART

Various types of secondary battery systems have been proposed to detect a state of a secondary battery. For example, in Patent Literatures 1 to 4, a charging state (a storage amount or SOC) of a secondary battery is detected based on battery voltage of the secondary battery. In Patent Literature 4, furthermore, a deterioration or degradation state of the secondary battery is also detected based on a SOC (State Of Charge) calculated based on battery voltage and a battery temperature detected by a temperature detecting device.

CITATION LIST

Patent Literature

Patent Literature 1: JP 2007-292778 A
Patent Literature 2: JP 11 (1999)-346444 A
Patent Literature 3: JP 7 (1995)-294611 A
Patent Literature 4: JP 2001-33532 A
Patent Literature 5: JP 2003-36889 A

SUMMARY OF INVENTION

Technical Problem

However, in the techniques proposed in Patent Literatures 1 to 4, when an amount of change (a change amount) of the battery voltage associated with a change in storage amount is small, there is a possibility that the charging state (the storage amount or SOC) of the secondary battery may not be appropriately detected. In such case, the technique of Patent Literature 4 also may not appropriately detect the deterioration state of the secondary battery.

Recently, there is proposed a lithium ion secondary battery capable of having an output density which varies in a small range and providing stable output characteristics (e.g., see Patent Literature 5). The secondary battery disclosed in Patent Literature 5 exhibits a very small change in battery voltage associated with a change in storage amount over a capacity range of 50% or more of the entire theoretical electric capacity (specifically, a capacity range corresponding to 25% to 80% SOC). For such secondary battery, particularly, there is a possibility that the state of the secondary battery (the charging state and the deterioration state) could not be detected.

The present invention has been made in view of the circumstances to solve the above problems and has a purpose to provide a secondary battery system capable of accurately detecting a state of a secondary battery system (a state of a secondary battery, abnormality of the secondary battery system, and others).

Solution to Problem

One aspect of the invention provides a secondary battery system including a secondary battery, wherein the secondary battery includes an electrode body having a first electrode plate, a second electrode plate, and a separator, the first electrode plate including a first active material that makes a phase change by charge and discharge, and the second electrode plate including a second active material that performs two-phase coexistence type charge and discharge, the secondary battery system comprising: dV/dQ calculation means for calculating a dV/dQ value that is a ratio of a change amount dV of a battery voltage V of the secondary battery with respect to a change amount dQ of a storage amount Q of the secondary battery when the storage amount Q is changed during charge and discharge of the secondary battery, wherein a state of the secondary battery system is detected by use of a characteristic point appearing in a Q-dV/dQ curve representing a relationship between the storage amount value Q and the dV/dQ value or a characteristic point appearing in a V-dV/dQ curve representing a relationship between the battery voltage value V and the dV/dQ value.

In the secondary battery having the first active material that makes a phase change by charge and discharge, characteristic points (the maximum point, the minimum point, etc.) clearly appear in the aforementioned Q-dV/dQ curve and V-dV/dQ curve. It is to be noted that the "first active material that makes a phase change by charge and discharge" indicates an active material whose crystal structure changes in the course of charge and discharge. One example thereof is a carbon material. This carbon material may include a natural graphite material, an artificial graphite material (meso carbon microbeads, etc.), a hardly graphitizable carbon material, and others.

In the above secondary battery system, the first electrode plate includes the first active material that makes the phase change by charge and discharge and the second electrode plate includes the second active material that performs two-phase coexistence type charge and discharge. In such secondary battery, the characteristic points (the maximum point, the minimum point, etc.) clearly appear in the aforementioned Q-dV/dQ curve and V-dV/dQ curve. In the above secondary battery system, therefore, the state of the secondary battery can be accurately detected by use of the clear characteristic points.

It is to be noted that the "second active material that performs two-phase coexistence type charge and discharge" indicates an active material that performs charge and discharge in a state where two crystals having different crystal structures coexist. For example, it may include a compound of an olivine structure expressed by $LiFe_{(1-X)}M_XPO_4$ (M is at least one of Mn, Cr, Co, Cu, Ni, V, Mo, Ti, Zn, Al, Ga, Mg, B, and Nb, $0 \leq X \leq 0.5$) and $LiMn_{(1-X)}M_XPO_4$ (M is at least one of Cr, Co, Cu, Ni, V, Mo, Ti, Zn, Al, Ga, Mg, B, and Nb, $0 \leq X \leq 0.5$).

In the above secondary battery system, the dV/dQ value is used to detect the state of the secondary battery system. Specifically, the characteristic point appearing in the Q-dV/dQ curve or the characteristic point appearing in the V-dV/dQ curve is used to detect the state of the secondary battery. This can accurately detect the state of the secondary battery system.

The detectable state of the secondary battery system may include for example a state of the secondary battery and abnormality of the secondary battery system. The state of the secondary battery is for example a charging state (a storage amount and SOC) and a deterioration state of the secondary battery. The deterioration state of the secondary battery may include for example a decrease in battery capacity (a full charging capacity) and an increase in internal resistance. The abnormality of the secondary battery system is for example an internal micro-short circuit of the secondary battery and a connection failure of the secondary battery.

To be specific, even in a range where the change amount of the battery voltage V associated with the change in the storage amount Q is small, the change amount of the dV/dQ value associated with the change in the storage amount Q tends to increase. Accordingly, the use of the dV/dQ value (specifically, the use of the characteristic point appearing in the Q-dV/dQ curve or the characteristic point appearing in the V-dV/dQ curve) in detecting the state of the secondary battery system enables accurate detection of the state of the secondary battery system. For example, by using the dV/dQ value (specifically, the use of the characteristic point appearing in the Q-dV/dQ curve or the characteristic point appearing in the V-dV/dQ curve) in detecting the state of the secondary battery, the state of the secondary battery (the charging state and the deterioration state) can be accurately detected. Furthermore, based on the dV/dQ value (specifically, the use of the characteristic point appearing in the Q-dV/dQ curve or the characteristic point appearing in the V-dV/dQ curve), abnormality of the secondary battery system (internal micro-short circuit of the secondary battery and connection failure of the secondary battery) can be appropriately detected.

In the above secondary battery system, preferably, the secondary battery has a characteristic point in a Q-dV/dQ curve representing a relationship between the storage amount value Q and the dV/dQ value in relation to the secondary battery.

The characteristic point in the Q-dV/dQ curve indicates a maximum point, a minimum point, an inflection point. The characteristic point in the Q-dV/dQ curve is very easy to detect. Thus, the use of this characteristic point makes it possible to more accurately detect the state of the secondary battery system.

For example, in the secondary battery system that estimates the storage amount of the secondary battery, there is a case where a deviation is caused between an actual storage amount and an estimated storage amount due to any reasons. Therefore, the storage amount value Q at the characteristic point in the Q-dV/dQ curve (referred to as a reference characteristic value QK) is stored in the system in advance and the reference characteristic value QK and the storage amount Q at the characteristic point (the estimated characteristic value QS) estimated in the secondary battery system are compared. By calculating a difference value between the reference characteristic value QK and the estimated characteristic value QS, an estimation deviation (an estimation error) in the secondary battery system can be detected. Accordingly, for example, correcting the estimated storage amount with the difference value enables detection of a high-accurate storage amount Q. By use of the characteristic point in the Q-dV/dQ curve, as mentioned later, the decrease in battery capacity (full charging capacity) can be accurately detected.

In one of the above secondary battery systems, preferably, the secondary battery includes a characteristic point in a V-dV/dQ curve representing a relationship between the battery voltage value V and the dV/dQ value related to the relevant secondary battery.

The characteristic point in the V-dV/dQ curve indicates a maximum point, a minimum point, an inflection point. The characteristic point in the V-dV/dQ curve is very easy to detect. Thus, the use of this characteristic point makes it possible to more accurately detect the state of the secondary battery.

To be specific, for example, the use of the characteristic point in the V-dV/dQ curve enables accurate detection of the increase in internal resistance of the secondary battery, as mentioned later.

In the secondary battery systems, preferably, the secondary battery system determines, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve, and the secondary battery system detects the state of the secondary battery system based on the storage amount value Q at the characteristic point in the Q-dV/dQ curve, a difference value of the storage amount Q between two characteristic points in the Q-dV/dQ curve, or a difference value of the battery voltage V between two characteristic points in the V-dV/dQ curve.

In one of the above secondary battery systems, preferably, the second active material is $LiFe_{(1-X)}M_XPO_4$ (M is at least one of Mn, Cr, Co, Cu, Ni, V, Mo, Ti, Zn, Al, Ga, Mg, B, Nb, and $0 \leq X \leq 0.5$), and the first active material is a carbon material.

The secondary battery using the carbon material as the first active material and $LiFe_{(1-X)}M_XPO_4$ as the second active material can charge and discharge an electrical quantity corresponding to about 80% of a theoretical electric capacity at a battery voltage of about 3.4V. Accordingly, the above secondary battery system can charge and discharge at a relatively high battery voltage of about 3.4V over a capacity range of about 80% of a theoretical electric capacity. Thus, high output can be stably obtained.

Meanwhile, in the case of the secondary battery that is small in battery voltage variation over a wide capacity range of about 80% of the theoretical electric capacity, a method of detecting a state (a charging state and a deterioration state) of the secondary battery based on the battery voltage could not appropriately detect the state of the secondary battery. However, the aforementioned secondary battery system detects the state of the secondary battery based on the dV/dQ value. The state of the secondary battery can therefore be detected accurately.

Preferably, one of the above secondary battery systems further comprises: storage amount estimating means for estimating a storage amount Q of the secondary battery; determining means for determining, based on the dV/dQ value, whether or not the secondary battery has reached the state corresponding to the characteristic point appearing in the Q-dV/dQ curve; and storage amount correcting means for correcting the estimated storage amount Q, the storage amount correcting means corrects the estimated storage amount Q by a difference value obtained by subtracting an estimated characteristic value that is a storage amount value Q of the secondary battery estimated by the storage amount estimating means when the determining means determines that the secondary battery has reached the state corresponding to the characteristic point from a reference characteristic value that is a storage amount value Q at the characteristic point stored in advance in the secondary battery system.

In the secondary battery system that estimates the storage amount Q of the secondary battery, there is a case where a deviation occurs between an actual storage amount and an estimated storage amount due to any reasons.

On the other hand, in the above secondary battery, the estimated storage amount Q is corrected by using the dV/dQ value. To be specific, for example, the storage amount value Q at the characteristic point in the aforementioned Q-dV/dQ curve (referred to as a reference characteristic value QK) is stored in advance in the system. Thus, the reference characteristic value QK and the storage amount Q at the characteristic point estimated in the secondary battery system (referred to as an estimated characteristic value QS) are compared. By calculating a difference value between the reference characteristic value QK and the estimated characteristic value QS, an estimation deviation in the secondary battery system can be detected. Accordingly, correcting the estimated storage amount with the difference value enables detection of a high-accurate storage amount Q.

As above, the above secondary battery system can detect the storage amount Q with high accuracy.

Preferably, one of the secondary battery systems further comprises: deterioration detecting means for detecting deterioration of the secondary battery; and, determining means for determining, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve, and the deterioration detecting means determines that the secondary battery has been deteriorated when the difference value of the storage amount Q between the two specific characteristic points selected from a plurality of characteristic points appearing in the Q-dV/dQ curve determined by the determining means is smaller than a previously set reference difference value or when the difference value of the battery voltage V between the two specific characteristic points selected from a plurality of characteristic points appearing in the V-dV/dQ curve determined by the determining means is larger than a previously set reference difference value.

The above secondary battery system detects deterioration of the secondary battery by using the dV/dQ value. The deterioration of the secondary battery may include for example a decrease in battery capacity (full charging capacity), an increase in internal resistance, and others.

To be specific, the present inventors found the characteristic that as the battery capacity (the full charging capacity) of the secondary battery became lower, the difference value $\Delta Q$ of the storage amount Q corresponding to each characteristic point (a maximum point, a minimum point, etc.) became smaller in the above Q-dV/dQ curve. By utilizing this characteristic, for example, the decrease in battery capacity (the full charging capacity) can be detected based on the difference value $\Delta Q$.

The present inventors also found the characteristic that as the internal resistance of the secondary battery became higher, the difference value $\Delta V$ of the battery voltage V corresponding to each characteristic point (a maximum point, a minimum point, etc.) became larger in the above V-dV/dQ curve. By utilizing this characteristic, for example, the increase in internal resistance of the secondary battery can be detected based on the difference value $\Delta V$.

In the secondary battery system, preferably, the secondary battery system comprises the determining means for determining, based on the dV/dQ value, whether or not the secondary battery reached the state corresponding to the characteristic point appearing in the Q-dV/dQ curve, the deterioration detecting means includes capacity decrease detecting means for detecting a decrease in battery capacity of the secondary battery, the capacity decrease detecting means compares the reference difference value of the secondary battery in an initial state, the reference difference value being a difference value of the storage amount Q between the two characteristic points in the Q-dV/dQ curve and being stored in advance in the secondary battery system with an actual difference value that is a difference value of the storage amount Q between the two characteristic points in the Q-dV/dQ curve determined by the determining means, and determines that the battery capacity of the secondary battery has been decreased when the actual difference value is smaller than the reference difference value.

As described above, as the battery capacity (the full charging capacity) of the secondary battery becomes lower, the difference value $\Delta Q$ of the storage amount Q corresponding to each characteristic point (a maximum point, a minimum point, etc.) becomes smaller in the above Q-dV/dQ curve. By utilizing this characteristic, for example, the decrease in battery capacity (the full charging capacity) can be detected based on the difference value $\Delta Q$ in the Q-dV/dQ curve.

To be specific, for example, a difference value $\Delta Q$ (referred to as a reference difference value $\Delta QK$) between a storage amount at a characteristic point A and a storage amount at another characteristic point C in the Q-dV/dQ curve obtained from the secondary battery before deterioration (in an initial state) is calculated and this reference difference value $\Delta QK$ is stored in advance in the system. In the secondary battery system, the difference value $\Delta Q$ is calculated at predetermined timeintervals (referred to as an actual difference value $\Delta QS$) and this actual difference value $\Delta QS$ is compared with the reference difference value $\Delta QK$.

If the actual difference value $\Delta QS$ is smaller than the reference difference value $\Delta QK$, it can be determined that the capacity of the secondary battery has been decreased. By comparison between the reference difference value $\Delta QK$ and the actual difference value $\Delta QS$, it is also possible to estimate the degree of decrease in capacity of the secondary battery. Furthermore, the storage amount Q estimated in the system can also be corrected based on the estimated degree of decrease in capacity.

In one of the secondary battery systems, preferably, the secondary battery system comprises the determining means for determining, based on the dV/dQ value, whether or not the secondary battery has reached the state corresponding to the characteristic point appearing in the V-dV/dQ curve, the deterioration detecting means includes resistance increase detecting means for detecting an increase in internal resistance of the secondary battery, the resistance increase detecting means compares a reference difference value of the secondary battery in an initial state, the reference difference value being a difference value of the battery voltage V between the two characteristic points in the V-dV/dQ curve and being stored in advance in the secondary battery system with an actual difference value that is a difference value of the battery voltage V between the two characteristic points in the V-dV/dQ curve determined by the determining means, and determines that the internal resistance of the secondary battery has been increased when the actual difference value is larger than the reference difference value.

As described above, as the internal resistance of the secondary battery increases, the difference value $\Delta V$ of the battery voltage V at each characteristic point (a maximum point, a minimum point, etc.) becomes larger in the V-dV/dQ curve. By utilizing this characteristic, for example, the increase in internal resistance of the secondary battery can be detected based on the difference value $\Delta V$ in the V-dV/dQ curve.

To be specific, for example, a difference value ΔV (referred to as a reference difference value ΔVK) between a battery voltage at a characteristic point D and a battery voltage at another characteristic point E in the V-dV/dQ curve obtained from the secondary battery before deterioration (in an initial state) is calculated and this difference value ΔVK is stored in advance in the system. In the secondary battery system, furthermore, a difference value ΔV is calculated at predetermined time intervals (referred to as an actual difference value ΔVS) and this actual difference value ΔVS is compared with the reference difference value ΔVK.

If the actual difference value ΔVS is larger than the reference difference value ΔVK, it can be determined that the internal resistance of the secondary battery has been increased. By comparison between the reference difference value ΔVK and the actual difference value ΔVS, it is also possible to estimate the degree of increase in internal resistance. Furthermore, the storage amount Q estimated in the system can also be corrected by the estimated degree of increase in internal resistance.

Preferably, one of the secondary battery systems further comprises: abnormality detecting means for detecting abnormality of the secondary battery system; and determining means for determining, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve, the abnormality detecting means determines that the secondary battery system is abnormal when the difference value of the storage amount Q between two specific characteristic points selected from a plurality of characteristic points appearing in the Q-dV/dQ curve determined by the determining means is smaller than a previously set reference difference value and smaller than a predetermined threshold, or when the difference value of the battery voltage V between two specific characteristic points selected from a plurality of characteristic points appearing in the V-dV/dQ curve determined by the determining means is larger than a previously set reference difference value and larger than a predetermined threshold.

In the above secondary battery system, abnormality of the secondary battery is detected by use of the dV/dQ value. Detectable abnormalities of the secondary battery system may include for example the occurrence of an internal micro-short circuit in the secondary battery, the connection failure of the secondary battery (a connection failure of a connection terminal of a cable connected to an external terminal of the secondary battery, a connection failure of a connecting member that connects terminals of two secondary batteries, and others).

To be concrete, in the secondary battery in which the internal micro-short circuit has occurred, the difference value ΔQ of the storage amount Q corresponding to each characteristic point (a maximum point, a minimum point, etc.) in the above Q-dV/dQ curve is extremely small as compared with the secondary battery in which no micro-short circuit has occurred (including a secondary battery whose capacity has been decreased). If the difference value ΔQ is smaller than a predetermined threshold (e.g., 60% of the reference difference value ΔQK), for example, it can be determined by utilizing the above characteristic that an internal micro-short circuit has occurred in the secondary battery.

When the connection failure of the secondary battery has occurred, the difference value ΔV of the battery voltage V corresponding to each characteristic point (a maximum point, a minimum point, and others) in the above V-dV/dQ curve is extremely large as compared in the case where no connection failure has occurred. If the difference value ΔV is larger than a predetermined threshold (e.g., three times of the reference difference value ΔVK), for example, it can be determined by utilizing the above characteristic that a connection failure has occurred.

In the secondary battery system, preferably, the secondary battery system comprises the determining means for determining, based on the dV/dQ value, whether or not the secondary battery has reached the state corresponding to the characteristic point appearing in the Q-dV/dQ curve, the abnormality detecting means includes micro-short circuit detecting means for detecting a micro-short circuit of the secondary battery the micro-short circuit detecting means compares the reference difference value of the secondary battery in an initial state, the reference difference value being a difference value of the storage amount Q between the two characteristic points in the Q-dV/dQ curve and being stored in advance in the secondary battery system with an actual difference value that is a difference value of the storage amount Q between the two characteristic points in the Q-dV/dQ curve determined by the determining means, and determines that a micro-short circuit has occurred in the secondary battery when the actual difference value is smaller than the reference difference value and smaller than the predetermined threshold.

As described above, in the secondary battery in which the internal micro-short circuit has occurred, the difference value ΔQ of the storage amount Q corresponding to each characteristic point (a maximum point, a minimum point, and others) in the Q-dV/dQ curve is extremely small as compared with the secondary battery in which no micro-short circuit has occurred (including the secondary battery whose capacity has been decreased). By utilizing this characteristic, for example, the internal micro-short circuit can be detected based on the difference value ΔQ.

To be specific, for example, a difference value ΔQ (referred to as a reference difference value ΔQK) between a storage amount corresponding to a characteristic point A and a storage amount corresponding to another characteristic point C in the Q-dV/dQ curve obtained from the secondary battery in which no micro-short circuit has occurred (in an initial state) is calculated and this reference difference value ΔQK is stored in advance in the system. In the secondary battery system, the difference value ΔQ is calculated at predetermined time intervals (referred to as an actual difference value ΔQS) and this actual difference value ΔQS is compared with the reference difference value ΔQK. If the actual difference value ΔQS is smaller than a predetermined threshold (e.g., a value corresponding to 60% of the reference difference value ΔQK), it can be determined that the internal micro-short circuit has occurred in the secondary battery. In this case, a signal representing that the secondary battery is abnormal can be output to induce replacement of the secondary battery.

In one of the secondary battery systems, preferably, the secondary battery system comprises the determining means for determining, based on the dV/dQ value, whether or not the secondary battery has reached the state corresponding to the characteristic point appearing in the V-dV/dQ curve, the abnormality detecting means includes connection failure detecting means for detecting connection failure of the secondary battery, the connection failure detecting means compares a reference difference value of the secondary battery in an initial state, the reference difference value being a difference value of the battery voltage V between the two characteristic points in the V-dV/dQ curve and being stored in advance in the secondary battery system with an actual difference value that is a difference value of the battery voltage V between the two characteristic points in the V-dV/dQ curve determined by the determining means, and determines that a connection failure of the secondary battery has occurred when the actual difference value is larger than the reference difference value and larger than the predetermined threshold.

As described above, if a connection failure of the secondary battery has occurred, the difference value ΔV of the battery voltage V corresponding to each characteristic point (a maximum point, a minimum point, and others) in the above V-dV/dQ curve is extremely large as compared with the case of normal connection. If the difference value ΔV is larger than a predetermined threshold, for example, it can be determined by utilizing this characteristic that the connection failure has occurred.

To be concrete, for example, a difference value ΔV (referred to as a reference difference value ΔVK) between a battery voltage corresponding to a characteristic point D and a battery voltage corresponding to another characteristic point E in the V-dV/dQ curve obtained from the secondary battery in an initial state without a connection failure is calculated and this reference difference value ΔVK is stored in advance in the system. In the secondary battery system, the difference value ΔV is calculated at predetermined time intervals (referred to as an actual difference value ΔVS) and this actual difference value ΔVS is compared with the reference difference value ΔVK. If the actual difference value ΔVS is larger than a predetermined threshold (e.g., a value corresponding to thee times of the reference difference value ΔVK), it can be determined that a connection failure has occurred. In this case, a signal representing the presence of the connection failure can be output to induce check of the connection.

Figure 1:
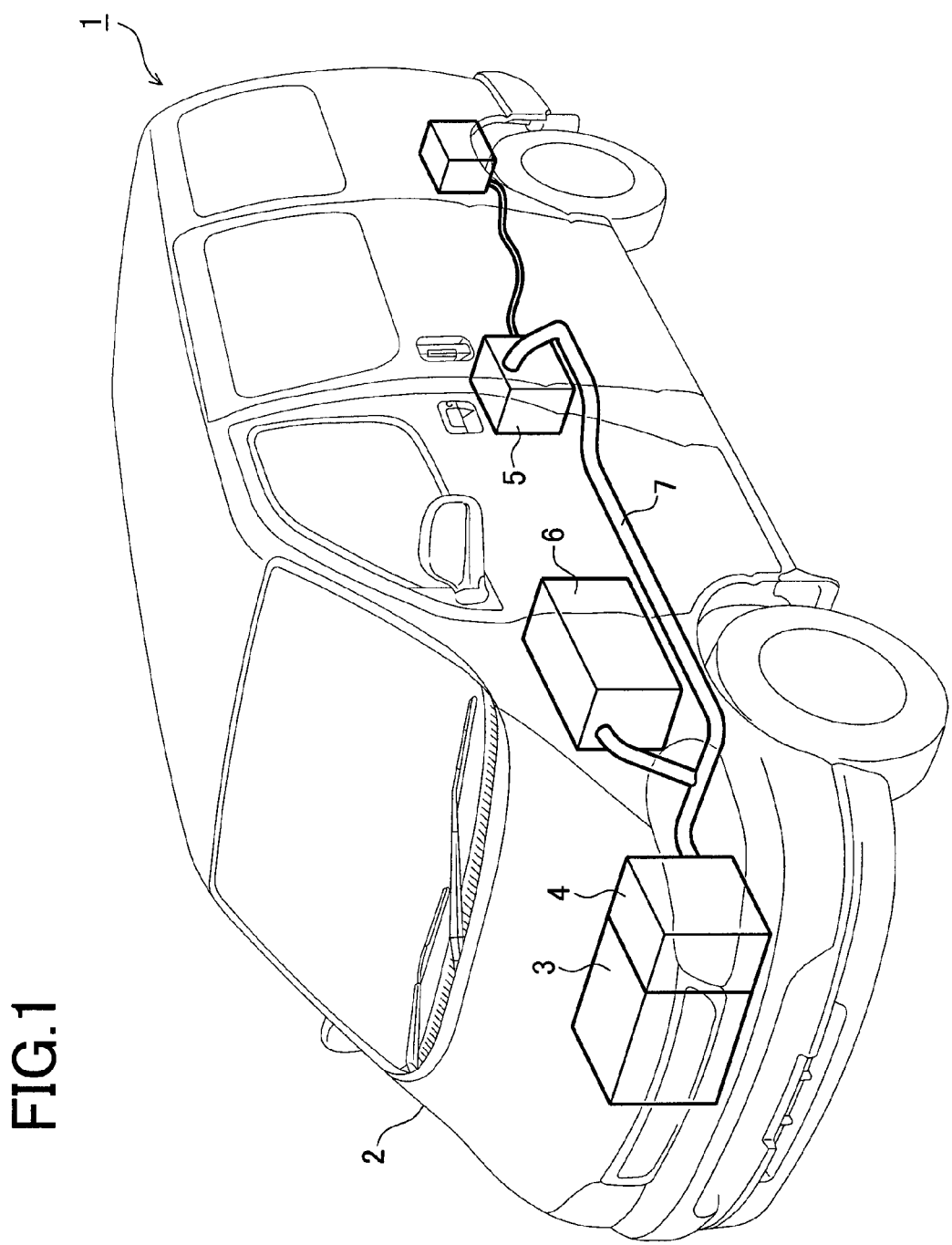
FIG. 1 is a schematic view of a hybrid electric vehicle in a first embodiment.

REFERENCE SIGNS LIST 6, 16, 26, 36 Secondary battery system
10 Assembled battery
30, 130, 230 Battery controller (dV/dQ calculation means, Storage amount estimating means, Storage amount correcting means, Deterioration detecting means, Capacity decrease detecting means, Resistance increase detecting means, Abnormality detecting means, micro-short circuit detecting means, Connection failure detecting means)
40 Voltage detecting means
50 Current detecting means
100 Secondary battery
120 Positive terminal
130 Negative terminal
150 Electrode body
153 Positive active material (Second active material)
154 Negative active material (First active material)
155 Positive electrode plate (Second electrode plate)
156 Negative electrode plate (First electrode plate)
157 Separator

DESCRIPTION OF EMBODIMENTS

First Embodiment

A detailed description of a first preferred embodiment of the present invention will now be given referring to the accompanying drawings.

A hybrid electric vehicle 1 is provided as shown in FIG. 1 with a vehicle body 2, an engine 3, a front motor 4, a rear motor 5, a cable 7, and a secondary battery system 6. This is a hybrid electric vehicle to be driven by combination of the engine 3, the front motor 4, and the rear motor 5. To be specific, the hybrid electric vehicle 1 is configured to run with the engine 3, the front motor 4, and the rear motor 5 by a known means, using the secondary battery system 6 as a drive power source of the front motor 4 and the rear motor 5.

Figure 2:
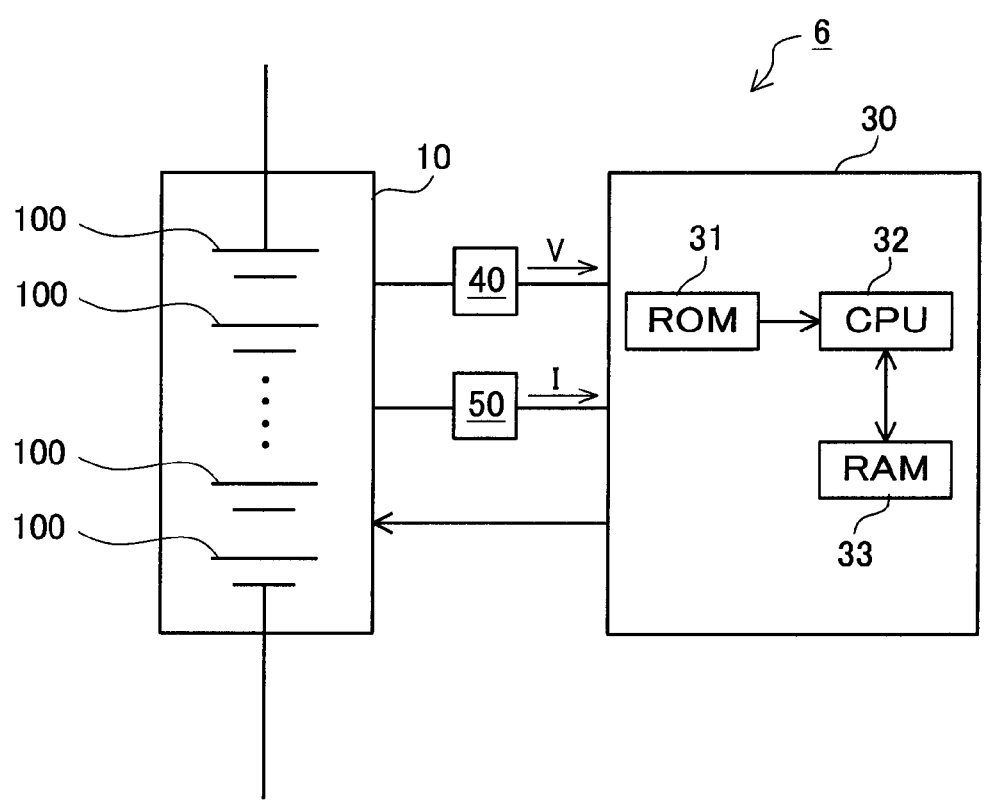
FIG. 2 is a schematic view of a secondary battery system in the first embodiment.

The secondary battery system 6 in the first embodiment is placed in the vehicle body 2 of the hybrid electric vehicle 1 and connected to the front motor 4 and the rear motor 5 through the cable 7. This secondary battery system 6 includes as shown in FIG. 2 an assembled battery 10 in which a plurality of secondary batteries 100 (cells) are electrically connected in series to each other, a voltage detector 40, a current detector 50, and a battery controller 30. The battery controller 30 has a ROM 31, a CPU 32, a RAM 32, and others.

The current detector 50 detects a current value I flowing in the secondary batteries 100 constituting the assembled battery 10. The voltage detector 40 detects battery voltage V (terminal voltage) of each secondary battery 100 constituting the assembled battery 10.

The battery controller 30 integrates the current values I detected by the current detector 50 at predetermined time intervals T to calculate a charging electrical quantity or a discharging electrical quantity of each secondary battery 100 and thereby estimates a storage amount Q of each secondary battery 100 based on the calculated charging or discharging electrical quantity. In sync with the current integration, the battery controller 30 further obtains battery voltage V of each secondary battery 100 detected by the voltage detector 40 at the predetermined time intervals T.

The battery controller 30 further calculates a dV/dQ value that is a ratio of a change amount dV of the battery voltage V of each secondary battery 100 with respect to a change amount dQ of the storage amount Q of the same secondary battery 100 when the storage amount Q varies. In other words, during charge/discharge of the secondary batteries 100, the battery voltage V of each secondary battery 100 is differentiated by the corresponding storage amount Q to calculate the dV/dQ value. To be specific, during charge/discharge of the secondary batteries 100, the battery controller 30 calculates the change amount dV of the battery voltage V and the change amount dQ of the storage amount Q at each predetermined time interval T by obtaining the battery voltage V and the storage amount Q at the predetermined time intervals T, and calculates the dV/dQ value at each predetermined time T based on those amounts.

The ROM 31 of the battery controller 30 stores a Q-dV/dQ curve K (see FIG. 9) in advance, which represents a relationship between the storage amount value Q and the dV/dQ value obtained from each secondary battery 100. The ROM 31 further stores a storage amount value Q at a characteristic point A (a maximum point) in the Q-dV/dQ curve K (referred to as a reference characteristic value QKA), a storage amount Q at a characteristic point B (a minimum point) (referred to as a reference characteristic value QKB), and a storage amount value Q at a characteristic point C (a maximum point) (referred to as a reference characteristic value QKC).

The battery controller 30 further plots the Q-dV/dQ curve in real time based on the dV/dQ values calculated at the predetermined time intervals T, and determines whether or not each secondary battery 100 has reached a state corresponding to one of the characteristic points A, B, and C in the Q-dV/dQ curve by comparison (pattern matching) between this Q-dV/dQ curve and the Q-dV/dQ curve K (see FIG. 9) stored in the ROM 31.

For example, if the secondary battery 100 is determined to have reached the state corresponding to the characteristic point A, the storage amount Q (referred to as a estimated characteristic value QSA) of the secondary battery 100 estimated by the battery controller 30 when the secondary battery 100 reaches the characteristic point A is compared with the reference characteristic value QKA stored in the ROM 31. Specifically, a difference value (QKA−QSA) is calculated by subtracting the estimated characteristic value QSA from the reference characteristic value QKA.

If an absolute value of this difference value (QKA−QSA) is larger than 0.1 Ah, for example, it is regarded as not a mere measurement error but as an estimation deviation of the storage amount in the secondary battery system 6. Accordingly, if the absolute value |QKA−QSA| of the difference value is larger than 0.1 Ah, the battery controller 30 in the first embodiment corrects the storage amount Q of the secondary battery 100 estimated by the battery controller 30 by the difference value (QKA−QSA). Specifically, the difference value (QKA−QSA) is added to the estimated storage amount Q to correct the storage amount Q. Then, the electrical quantity increased or decreased by charge or discharge is added to or subtracted from the corrected storage amount Q. Thus, a storage amount Q having no estimation deviation can be detected.

As above, the secondary battery system 6 in the first embodiment can accurately detect the storage amount Q of each secondary battery 100.

Even when the secondary battery 100 is determined to have reached the state corresponding to the characteristic point B or C, the difference value is calculated and, based on this difference value, the storage amount Q of the secondary battery 100 estimated by the battery controller 30 can be corrected in the same manner as in the above case where the secondary battery 100 is determined to have reached the state corresponding to the characteristic point A. Consequently, the storage amount Q of each secondary battery 100 can be accurately detected.

In the first embodiment, the battery controller 30 corresponds to dV/dQ calculation means, storage amount estimating means, and storage amount correcting means.

Figure 3:
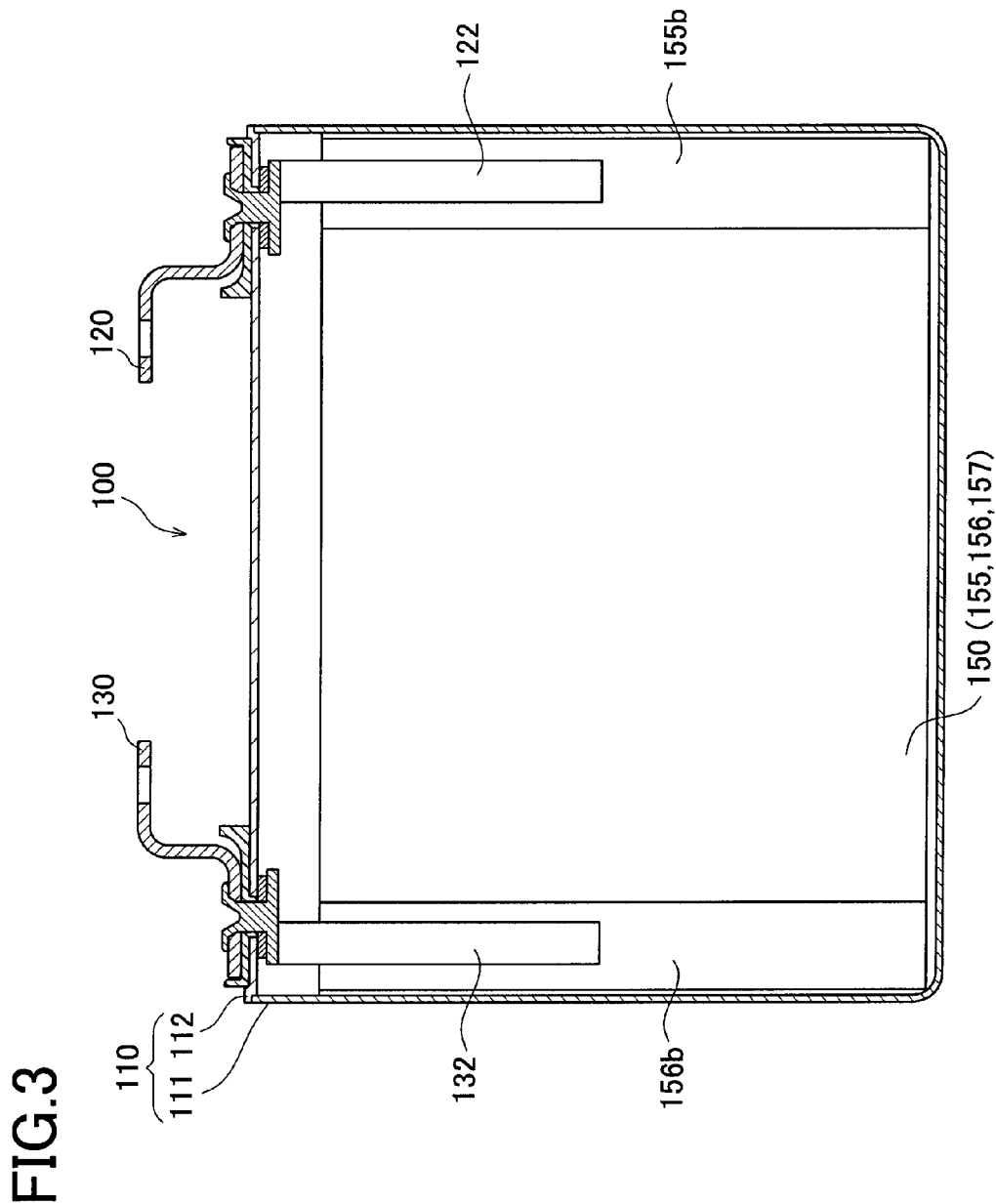
FIG. 3 is a sectional view of a secondary battery in the first embodiment.

The secondary battery 100 is a rectangular sealed lithium ion secondary battery provided with a rectangular parallelepiped battery case 110, a positive terminal 120, and a negative terminal 130 as shown in FIG. 3. The battery case 110 is made of metal and has a rectangular housing part 111 defining a rectangular parallelepiped housing space and a metal lid part 112. The battery case 110 (the rectangular housing part 111) contains an electrode body 150, a positive current collector 122, a negative current collector 132, and others.

Figure 4:
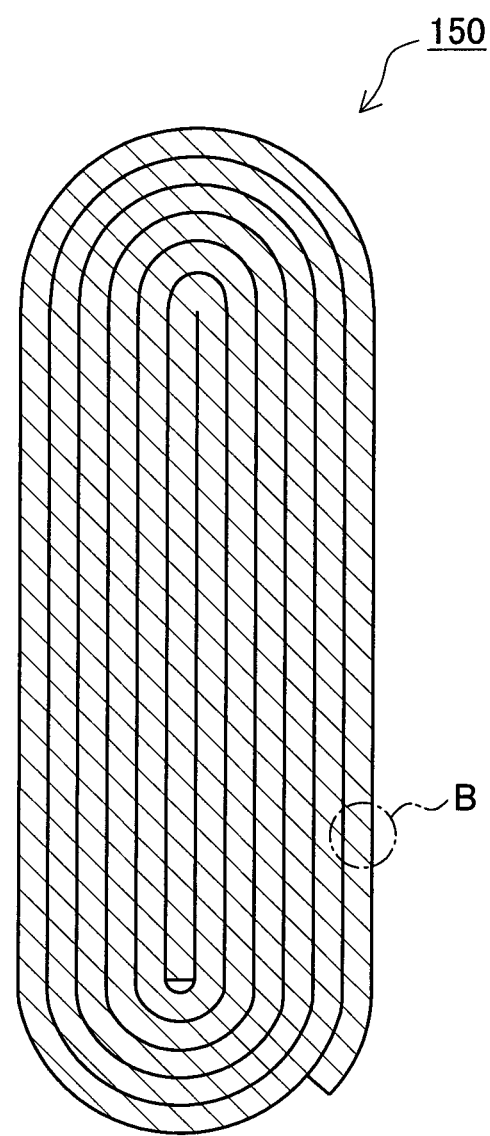
FIG. 4 is a sectional view of an electrode body in the first embodiment.
Figure 5:
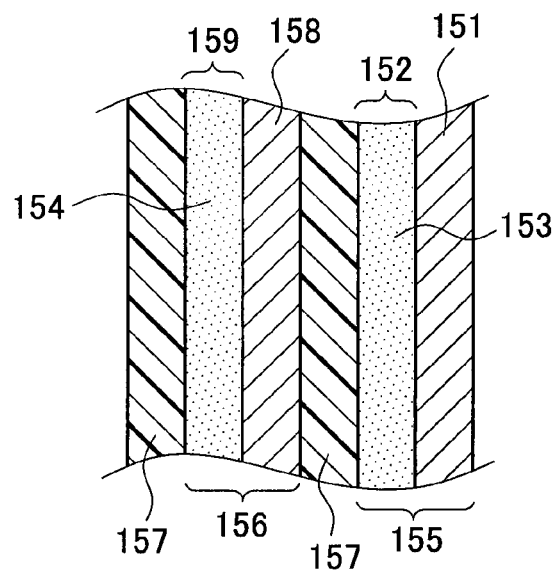
FIG. 5 is a partial sectional enlarged view of the electrode body in the first embodiment, corresponding to an enlarged view of a part B in FIG. 4.

The electrode body 150 a flat wound body having an elliptic cross section as shown in FIG. 4, produced by winding a sheet-like positive plate 155 (a second electrode plate), a sheet-like negative plate 156 (a first electrode plate), and a separator 57 as shown in FIG. 5. This electrode body 150 has a positive electrode winding part 155b located at one end (a right end in FIG. 3) in an axial direction thereof and constituted of only a part of the positive electrode plate 155 wound in spirally overlapping form and a negative electrode wound part 156b located at the other end (a left end in FIG. 3) and constituted of only a part of the negative electrode plate 156 wound in spirally overlapping form. A portion of the positive electrode plate 155 excepting the positive electrode wound part 155b is applied with a positive electrode mixture 152 containing a positive active material 153 (a second active material) (see FIG. 5). Similarly, a portion of the negative electrode plate 156 excepting the negative electrode wound part 156b is applied with a negative electrode mixture 159 containing a negative active material 154 (a first active material) (see FIG. 5). The positive electrode wound part 155b is electrically connected to the positive terminal 120 through the positive current collector 122. The negative electrode wound part 156b is electrically connected to the negative terminal 130 through the negative current collector 132.

Figure 6:
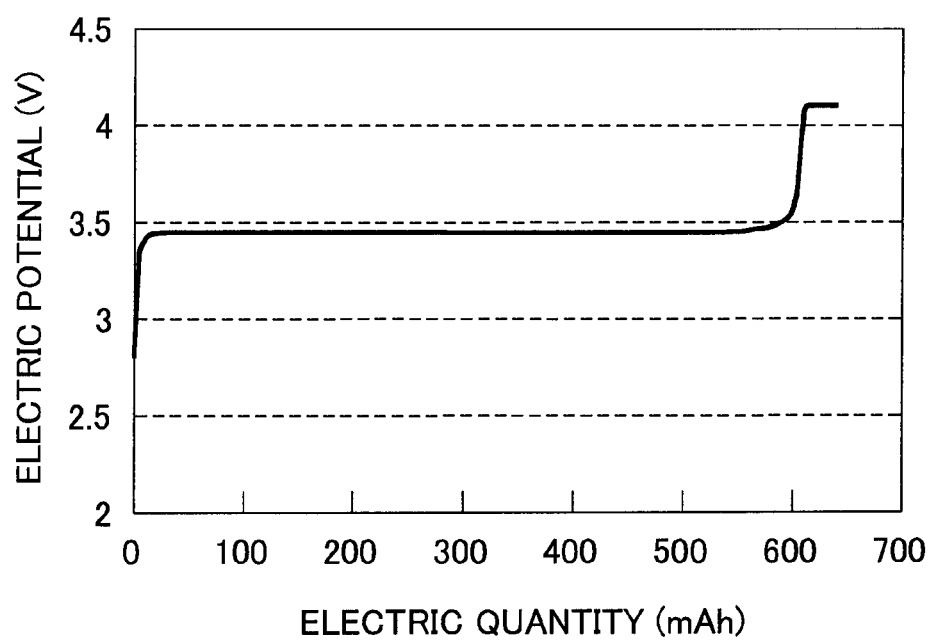
FIG. 6 is a graph showing an electric potential curve (vs. Li) of a positive active material.

In the first embodiment, $LiFePO_4$ is used for the positive active material 153. This positive active material 153 is an active material for performing two-phase coexistence type charge and discharge. Reaction of charge and discharge is carried out while two crystals having different crystalline structures coexist. A potential curve (vs. Li) of this positive active material 153 is shown in FIG. 6.

Figure 7:
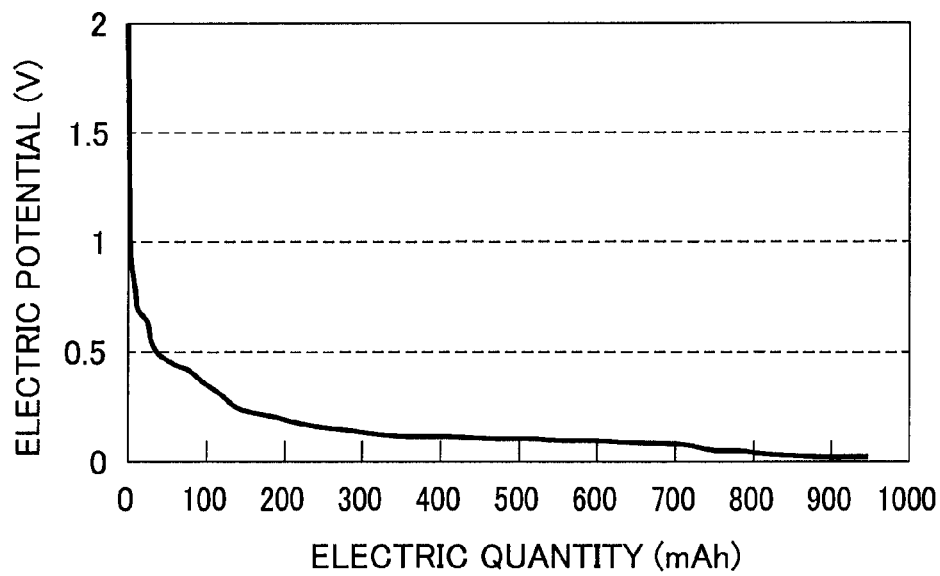
FIG. 7 is a graph showing an electric potential curve (vs. Li) of a negative active material.

In the first embodiment, furthermore, a carbon material (specifically, natural graphite) is used as the negative active material 154. To be specific, the natural graphite used herein has an average particle diameter of 20 μm, a grating constant CO of 0.67 nm, a crystallite size Lc of 27 nm, and a graphitization degree of 0.9 or higher. This negative active material 154 is an active material accompanied by phase changes during charge and discharge, in which its crystal structure will change in the course of charge and discharge. A potential curve (vs. Li) of this negative active material 154 is shown in FIG. 7.

Figure 8:
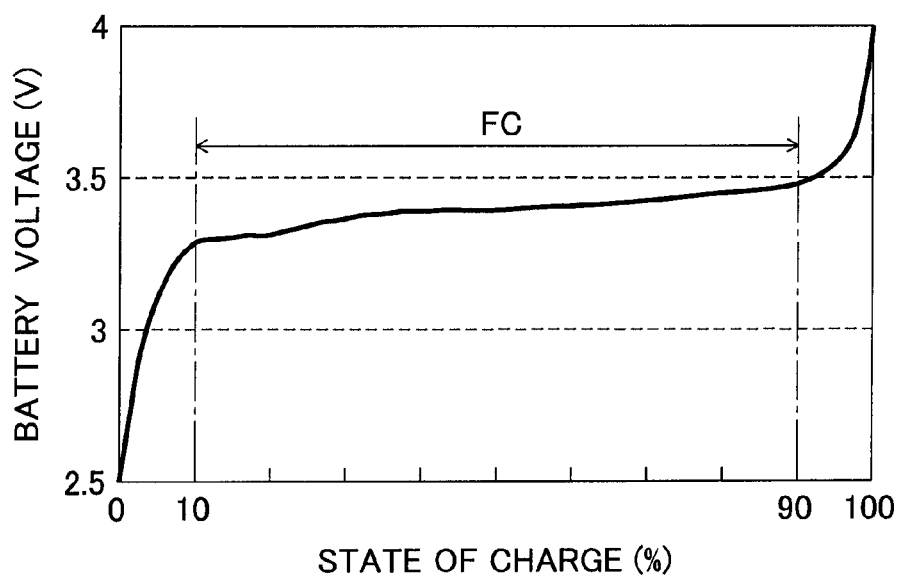
FIG. 8 is a charge characteristic graph of the secondary battery.

A charge characteristic diagram of the secondary battery 100 is shown in FIG. 8. FIG. 8 shows behaviors of the battery voltage V (in the first embodiment, the terminal voltage between the positive terminal 120 and the negative terminal 130) when the secondary battery 100 is charged with a current value of ⅓C. Herein, 1C is defined as a current value that allows the secondary battery 100 to be charged for one hour up to a theoretical electric capacity whereby the positive active material 153 ($LiFePO_4$) contained in the secondary battery 100 can be accumulated theoretically to the maximum. For the secondary battery 100, concretely, 1C is about 700 mA.

As shown in FIG. 8, the secondary battery 100 can charge and discharge the electrical quantity corresponding to about 80% of the theoretical electric capacity (a range of 0% to 100% SOC in FIG. 8) at a battery voltage of about 3.4 V (3.3 to 3.5 V). In the secondary battery system 6 in the first embodiment, accordingly, each secondary battery 100 can be charged and discharged with relatively high battery voltage of about 3.4 V, thereby stably achieving high output. A flat charge and discharge capacity range FC is defined as a capacity range for charge and discharge over a wide capacity range (a range of 10 to 90% SOC in the first embodiment) 50% or more of the theoretical electric capacity under the condition that variations of the battery voltage V are reduced to 0.2 V or less (0.2V in the first embodiment).

Figure 9:
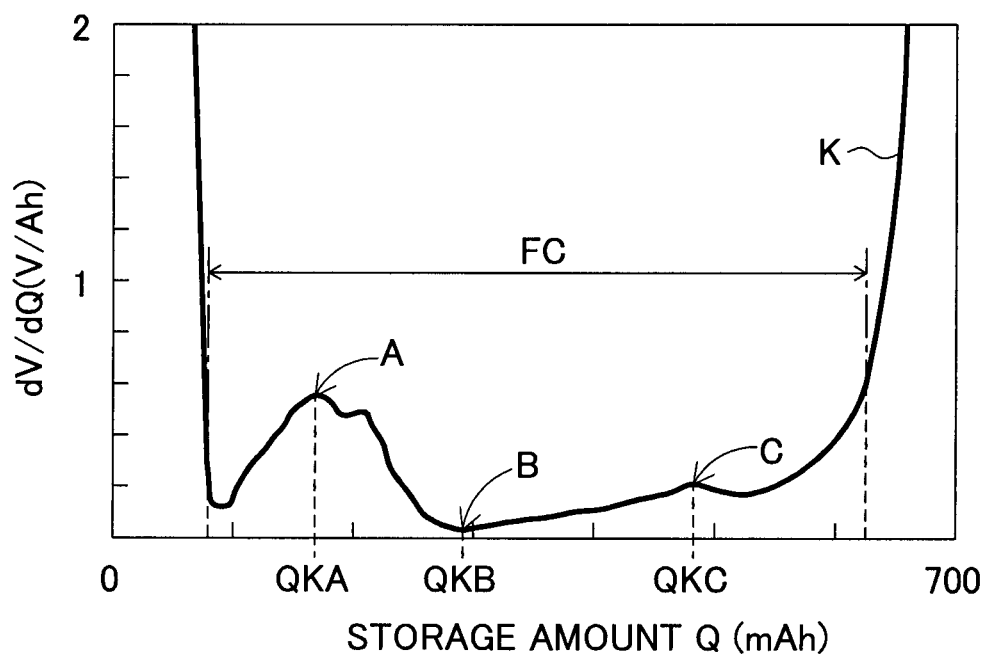
FIG. 9 is a graph showing a Q-dV/dQ curve of the secondary battery.

FIG. 9 shows a Q-dV/dQ curve K representing a relationship between the storage amount value Q and the dV/dQ value in the secondary battery 100. This Q-dV/dQ curve K is obtained by differentiating the battery voltage V by the corresponding storage amount Q with respect to a function shown in FIG. 8 of the storage amount Q and the battery voltage V. Specifically, when a battery voltage curve in FIG. 8 is to be created, a dV/dQ value which is a ratio of the change amount dV of the battery voltage V with respect to the change amount dQ of the storage amount Q at predetermined time intervals is calculated based on the storage amount Q and the battery voltage V obtained at intervals of a predetermined time T (e.g., 1 second). This relationship between the dV/dQ value and the storage amount Q is shown in FIG. 9. As shown in FIG. 9, in the Q-dV/dQ curve K, many characteristic points such as the characteristic point A (the maximum point), the characteristic point B (the minimum point), and the characteristic point C (the maximum point) appear. The values of battery voltage V at the characteristic points A, B, and C are 3.33 V, 3.40 V, and 3.43 V.

Meanwhile, as shown in FIG. 8, the secondary battery 100 has a flat charge-discharge capacity range FC in which variation of the battery voltage V is very small, over a wide capacity range (10% to 90% SOC) of about 80% of the theoretical electric capacity. In the case of the secondary battery providing small variation in battery voltage over the wide capacity range of about 80% of the theoretical electric capacity, the state of the secondary battery may not be accurately detected.

As shown in FIG. 9, however, even in the flat charge/discharge capacity range FC in which variation of the battery voltage V is very small, the dV/dQ value largely varies. In the secondary battery system 6 in the first embodiment, as mentioned later, this largely varying dV/dQ value is used to detect the state of the secondary battery 100. The state of the secondary battery 100 can therefore accurately be detected.

A method of detecting the charging state of the secondary batteries 100 constituting the assembled battery 10 in the first embodiment. Herein, the case of charging the secondary batteries 100 is exemplified. Alternatively, the charging state of the secondary batteries 100 can also be detected in the case of discharging the secondary batteries 100.

Figure 10:
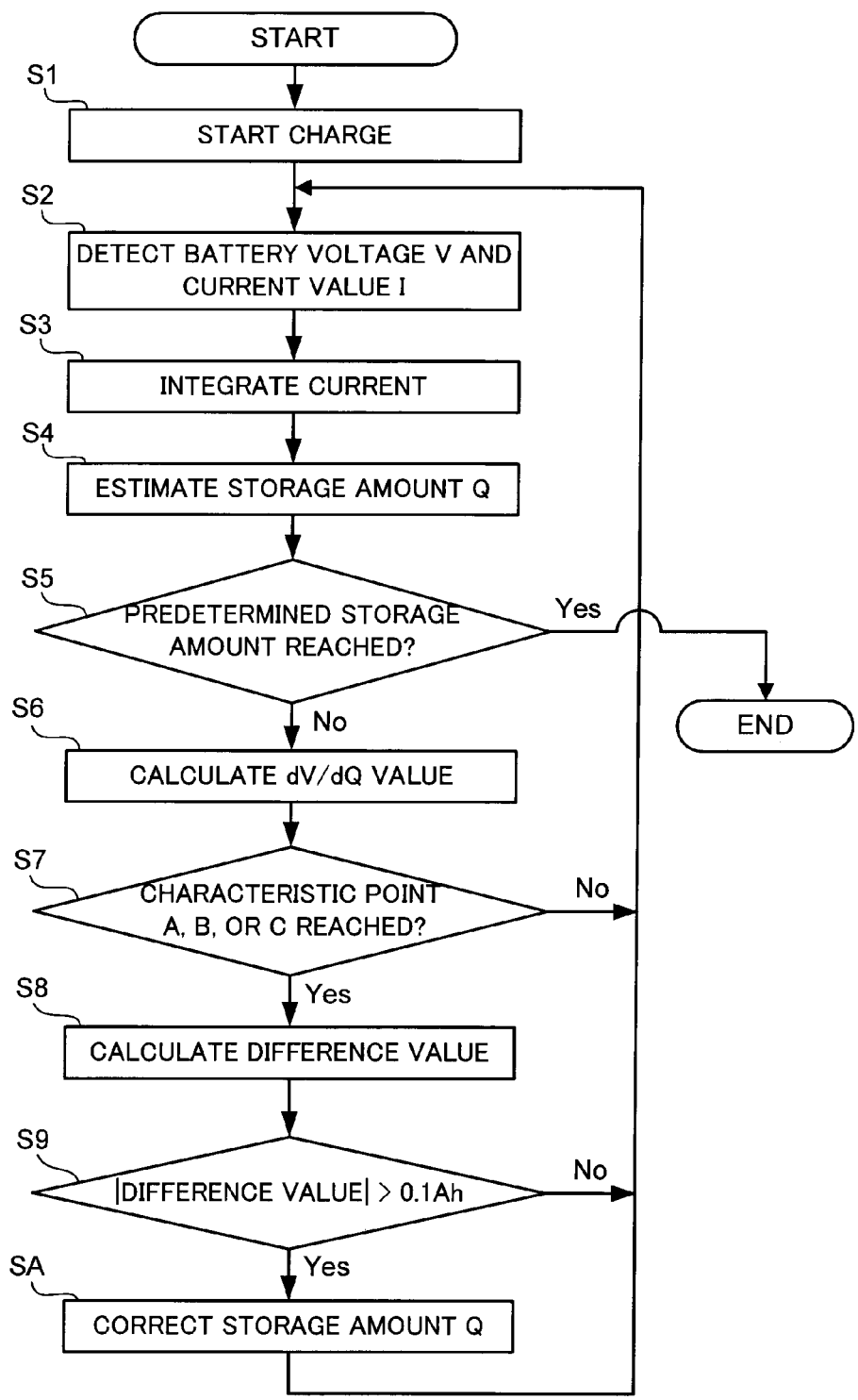
FIG. 10 is a flowchart showing the flow of detecting a state of the secondary battery in the first embodiment.

As shown in FIG. 10, in step S1, under the control of the battery controller 30, the secondary batteries 100 constituting the assembled battery 10 are started to be charged. In step S2, the voltage detector 40 detects the battery voltage V of each secondary battery 100 and the current detector 50 detects the current value I flowing in each secondary battery 100. In the first embodiment, the battery voltage V and the current value I are detected at intervals of the predetermined time (predetermined time intervals) T (e.g., 1 second).

In step S3, the current values I detected by the current detector 50 are integrated and the charging electrical quantity of each secondary battery 100 is calculated. In step S4, successively, the battery controller 30 estimates an electrical quantity (a storage amount Q) stored in each secondary battery 100 from the calculated charging electrical quantity. In the first embodiment, the storage amount Q is estimated at the predetermined time intervals T (e.g., 1 second) based on the current values I detected at the predetermined time intervals T.

In step S5, it is then determined whether or not the estimated storage amount Q has reached a predetermined storage amount. If it is determined that the estimated storage amount Q has reached the predetermined storage amount (Yes), charging is terminated.

If it is determined that the estimated storage amount Q does not reach the predetermined storage amount (No), the flow advances to step S6 in which the dV/dQ value which is a ratio of the change amount dV of the battery voltage V with respect to the change amount dQ of the storage amount Q is calculated for each secondary battery 100. In other words, the battery voltage V of each secondary batteries 100 is differentiated by the corresponding storage amount Q to calculate out the dV/dQ value. To be specific, for each secondary battery 100, the change amount dV of the battery voltage V and the change amount dQ of the storage amount Q at each predetermined time interval T is calculated based on the battery voltage V and the storage amount Q both being obtained at each predetermined time interval T. The dV/dQ value at each predetermined time interval T is calculated based on those change amounts.

In step S7, it is determined whether or not each secondary battery 100 has reached the state corresponding to one of the characteristic points A, B, and C in the Q-dV/dQ curve K. To be specific, the battery controller 30 plots the Q-dV/dQ curve in real time based on the dV/dQ values calculated at the predetermined time intervals T, and determines whether or not each secondary battery 100 has reached the state corresponding to one of the characteristic points A, B, and C in the Q-dV/dQ curve by comparison (pattern matching) between the above Q-dV/dQ curve and the Q-dV/dQ curve K (see FIG. 9) stored in the ROM 31.

If it is determined that the secondary battery 100 does not reach any of the characteristic points A, B, and C (No), the flow returns to step S2 and then the above steps S2 to S6 are repeated.

On the other hand, if it is determined that the secondary battery 100 has reached one of the characteristic points A, B, and C (Yes), the flow advances to step S8 in which the difference value (QK−QS) is calculated by subtracting the storage amount Q (referred to as a estimated characteristic value QS) of each secondary battery 100 estimated by the battery controller 30 at that time from the reference characteristic value QK at the relevant characteristic point.

For example, if it the secondary battery 100 is determined to have reached the state corresponding to the characteristic point A, the difference value (QKA−QSA) is calculated by subtracting the storage amount Q (the estimated characteristic value QSA) of the secondary battery 100 estimated by the battery controller 30 when the secondary battery 100 has reached the characteristic point A from the reference characteristic value QKA at the characteristic point A stored in the ROM 31.

In step S9, it is then determined whether or not an absolute value of the difference value is larger than 0.1 Ah. If the absolute value of the difference value (QK−QS) at one of the characteristic points A, B, and C is larger than 0.1 Ah, it is regarded as not a mere measurement error but as an estimation deviation of the storage amount in the secondary battery system 6. In the first embodiment, therefore, based on whether or not the absolute value of the difference value (QK−QS) is larger than 0.1 Ah, it is determined whether or not the estimation deviation of the storage amount occurs in the secondary battery system 6.

If it is determined in step S9 (No) that the absolute value of the difference value (QK−QS) is no more than 0.1 Ah, the flow returns to step S2 again and the processes in the above steps S2 to S8 are performed.

On the other hand, if it is determined in step S9 (Yes) that the absolute value of the difference value (QK−QS) is larger than 0.1 Ah, the flow advances to step SA in which the storage amount Q of the secondary battery 100 estimated by the battery controller 30 is corrected by the difference value (QK−QS). Specifically, the storage amount Q is corrected by adding the difference value (QK−QS) to the estimated storage amount Q. For example, if it is determined that the state corresponding to the characteristic point A is reached and the difference value (QKA−QSA) is 0.2 Ah, the storage amount Q is corrected by adding the difference value 0.2 (Ah) to the estimated storage amount Q.

Thereafter, the flow returns to step S2 again and the above processes in step S2 to S4 are performed. In step 4, accordingly, the storage amount Q without estimation deviation can be detected by adding the charging electrical quantity calculated by current integration to the corrected storage amount Q. In the secondary battery system 6 in the first embodiment, as above, the storage amount Q of each secondary battery 100 can be accurately detected.

If it is then determined in step S5 that the storage amount Q has reached the predetermined storage amount (Yes), charging is terminated.

A method of manufacturing the secondary batteries 100 in the first embodiment will be explained below.

Firstly, $LiFePO_4$ (the positive active material 153), acetylene black (a conductive additive), and polyvinylidene fluoride (binder resin) are mixed at a ratio of 85:5:10 (a weight ratio), and further N-methyl pyrrolidone (a dispersed solvent) is added to the mixture. Positive electrode slurry is thus prepared. This positive electrode slurry is applied on the surface of an aluminum foil 151, dried, and pressed. In this way, the positive electrode plate 155 is produced in which the surface of the aluminum foil 151 is applied with the positive electrode mixture 152 (see FIG. 5).

Natural graphite (the negative active material 154), styrene-butadiene copolymer (binder resin), and carboxymethyl cellulose (a thickening agent) are mixed in water at a ratio of 95:2.5:2.5 (a weight ratio), preparing a negative electrode slurry. This negative electrode slurry is applied onto the surface of a copper foil 158, dried, and pressed. In this way, the negative electrode plate 156 is produced in which the surface of the copper foil 158 is applied with the negative electrode mixture 159 (see FIG. 5). The negative active material 154 in the first embodiment is the natural graphite having an average particle diameter of 20 µm, a grating constant CO of 0.67 nm, a crystallite size Lc of 27 nm, and a graphitization degree of 0.9 or higher. In the first embodiment, coating amounts of the positive electrode slurry and the negative electrode slurry are regulated so that the ratio between the theoretical capacity of the positive electrode and the theoretical capacity of the negative electrode is 1:1.5.

Subsequently, the positive electrode plate 155, the negative electrode plate 156, and the separator 157 are laminated and wound to form the electrode body 150 having an elliptic cross section (see FIGS. 4 and 5). When the positive electrode plate 155, the negative electrode plate 156, and the separator 157 are to be laminated, the positive electrode plate 155 is placed to allow an uncoated portion of the positive electrode plate 155, on which the positive electrode mixture 152 is not applied, to protrude from one end of the electrode body 150. Furthermore, the negative electrode plate 156 is placed to allow an uncoated portion of the negative electrode plate 156, on which the negative electrode mixture 159 is not applied, to protrude from the other end opposite from the uncoated portion of the positive electrode plate 155. Thus, the electrode body 150 including the positive electrode wound part 155b and the negative electrode wound part 156b is produced (see FIG. 3). The separator 157 used in the first embodiment is a porous composite film having a three-layer structure of polypropylene, polyethylene, and polypropylene layers.

The positive electrode wound part 155b of the electrode body 150 is connected to the positive terminal 120 through the positive current collector 122. The negative electrode wound part 156b of the electrode body 150 is connected to the negative terminal 130 through the negative current collector 132. The above assembly is set in the rectangular housing part 111. This housing part 111 and the lid member 112 are welded to seal the battery case 110. Thereafter, an electrolyte is poured through a liquid inlet (not shown) provided in the lid member 112. The liquid inlet is then sealingly closed. Thus, the secondary battery 100 in the first embodiment is completed. The electrolyte used in the first embodiment is an electrolyte prepared by dissolving 1 mol of lithium hexafluorophosphate ($LiPF_6$) in a solution prepared by mixing EC (ethylene carbonate) and DEC (diethyl carbonate) at a ratio of 4:6 (a volume ratio).

Second Embodiment

Figure 11:
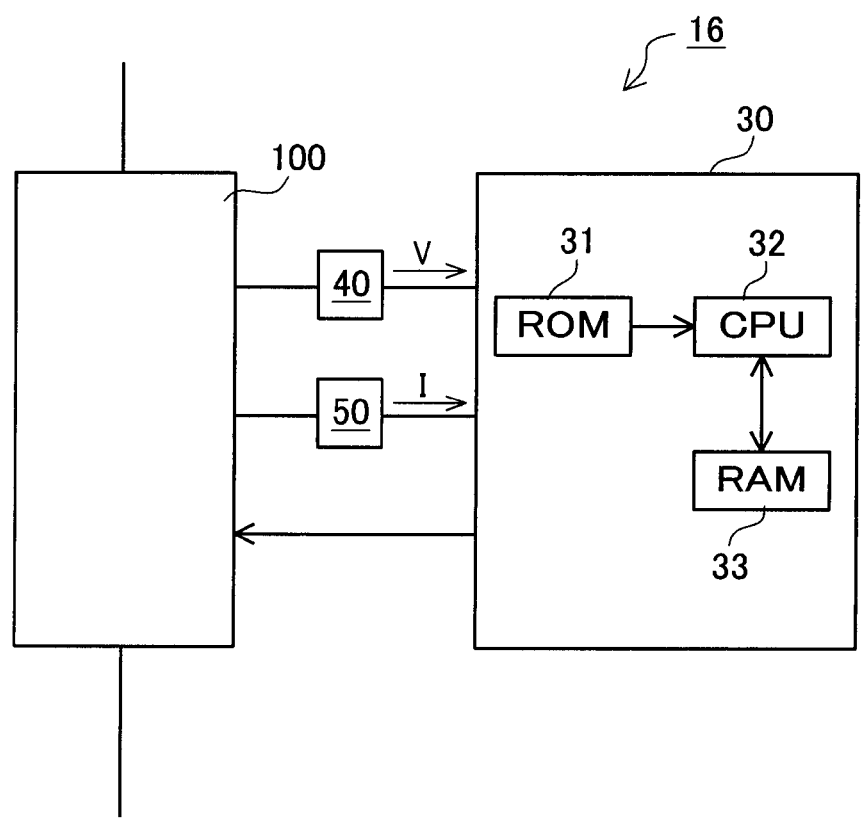
FIG. 11 is a schematic view of a secondary battery system in a second embodiment.

In a second embodiment, as shown in FIG. 11, a secondary battery system 16 including a secondary battery 100 (a cell), a voltage detector 40, a current detector 50, and a battery controller 30 is prepared. A test for evaluating state detection accuracy is performed on this secondary battery system 16.

Specifically, the secondary battery 100 is discharged until its battery voltage is reduced to 2.5 V and then charged with a current value of ⅓C. At that time, as with the steps S2 to S6 in the first embodiment, while battery voltage V and current I are detected at predetermined time intervals and a storage amount Q is estimated by current integration, thereby calculating a dV/dQ value based on the storage amount Q and the battery voltage V.

In the second embodiment, furthermore, a Q-dV/dQ curve (see FIG. 9) representing a relationship between the storage amount value Q and the dV/dQ value is plotted in real time and displayed on a monitor. By visually observing this Q-dV/dQ curve appearing on the monitor, charging is stopped when the characteristic point A is reached. Then, constant current discharging is carried out with a current value of ⅕C until the battery voltage is reduced to 2.5 V. A discharging capacity at that time is obtained as a storage amount QA1.

Additionally, four secondary batteries 100 are mounted in the secondary battery system 16. These batteries 100 are charged until they reach the characteristic point A and then they are discharged. A discharging capacity of each secondary battery 100 at that time is obtained as storage amounts QA2 to QA5. Thereafter, each value of the storage amounts QA1 to QA5 is divided by a theoretical electric capacity of the secondary batteries 100 and converted into a SOC value (%). A maximum value, a minimum value, and an average value of them are shown in a graph of FIG. 12.

Figure 12:
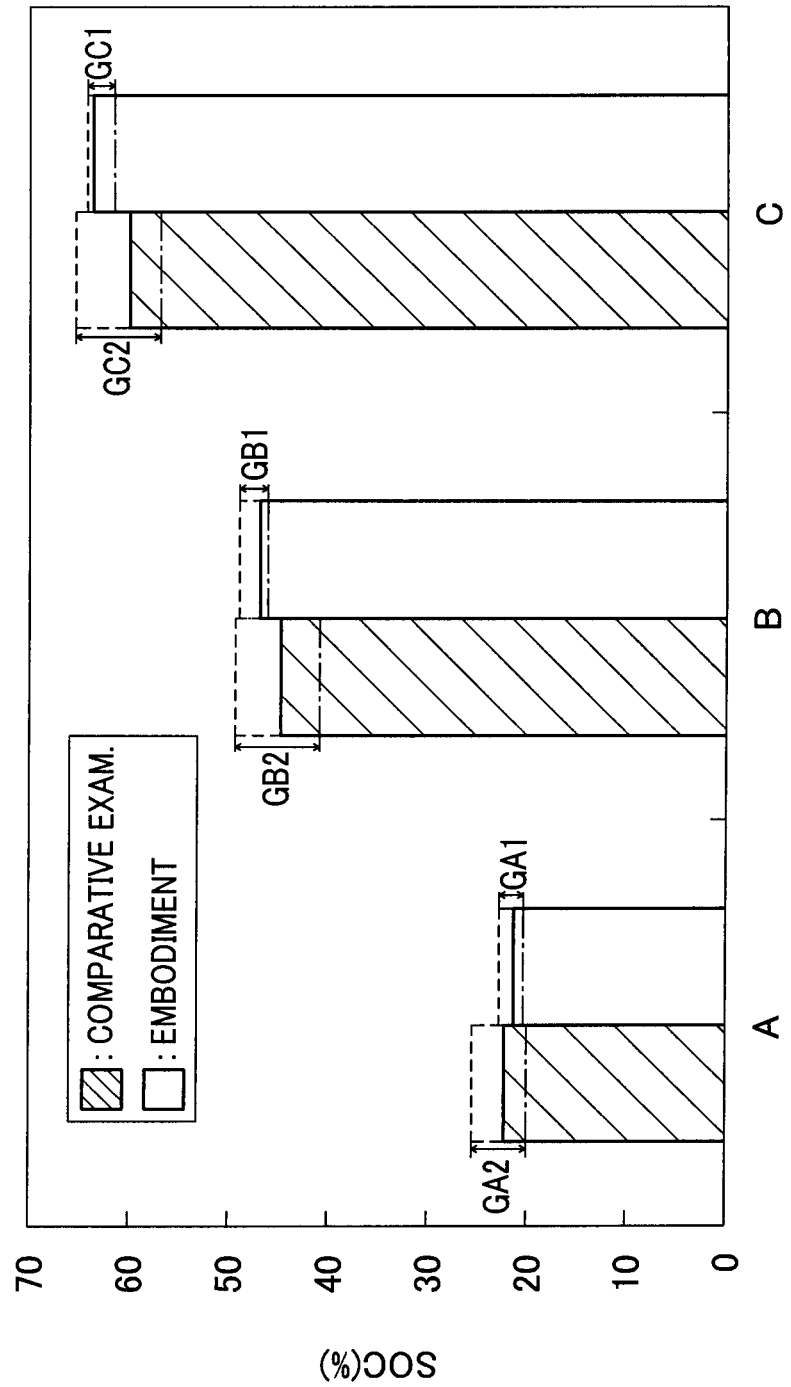
FIG. 12 is a graph for comparison of state detection accuracy between the second embodiment and a first comparative example.

In FIG. 12, the maximum value is indicated by a broken line, the minimum value is indicated by an alternate long and short dash line, and the average value is indicated by a solid line.

Similarly, storage amounts QB1 to QB5 are obtained when the secondary batteries are charged before each battery is determined to have reached the characteristic point B and storage amounts QC1 to QC5 are obtained when the secondary batteries are charged until each battery is determined to have reached the characteristic point C. Each of the storage amounts QB1 to QB5 and QC1 to QC5 is divided by the theoretical electric capacity and converted into a SOC value (%). A maximum value, a minimum value, and an average value of them are also shown in the graph of FIG. 12.

The battery voltage values when the characteristic points A, B, and C are reached are 3.33V, 3.40V, and 3.43V in this order.

As a comparative example, a secondary battery system is prepared for estimating a storage amount Q of a secondary battery 100 based on battery voltage V of the secondary battery 100. The secondary battery 100 is discharged until the battery voltage is reduced to 2.5V. Thereafter, in this secondary battery system, the secondary battery 100 is charged with a current value of ⅕C until its battery voltage V reaches 3.33V corresponding to the characteristic point A. The secondary battery 100 is then subjected to constant current discharge with a current value of ⅕C until the battery voltage is reduced to 2.5V. A discharging capacity at that time is obtained as a storage amount QA 11.

Additionally, a discharging capacity of each of other four secondary batteries 100 is also obtained in the same manner and referred to as a storage amount QA12 to QA15. Successively, each of the storage amounts QA11 to QA15 is divided by a theoretical electric capacity of the secondary battery 100 and converted into a SOC value (%). A maximum value, a minimum value, and an average value of them are shown in the graph of FIG. 12.

Furthermore, in the same manner as above, storage amounts QB 11 to QB 15 are obtained when the battery voltage V reaches 3.40V corresponding to the characteristic point B and storage amounts QC11 to QC15 are obtained when the secondary batteries 100 are charged until the battery voltage reaches 3.43V corresponding to the characteristic point C. Each of the storage amounts QB11 to QB 15 and QC 11 to QC15 is divided by the theoretical electric capacity and converted into a SOC value (%). A maximum value, a minimum value, and an average value of them are also shown in the graph of FIG. 12.

Herein, the state detection accuracy of the secondary battery system 16 in the second embodiment and the state detection accuracy of the secondary battery system in the comparative example are studied by comparison referring to FIG. 12.

Comparing the graph related to the characteristic point A, the second embodiment exhibits that a maximum difference GA1 (a difference between the maximum value and the minimum value) of the storage amounts QA1 to QA5 is about 3% in SOC terms. On the other hand, the comparative example exhibits that a maximum difference GA2 (a difference between the maximum value and the minimum value) of the storage amounts QA11 to QA15 is about 7% in SOC terms, which is a larger variation than in the second embodiment. This result reveals that the second embodiment could detect the charging state of the secondary battery with higher accuracy than the comparative example.

Further comparing the graph related to the characteristic point B, the second embodiment exhibits that a maximum difference GB1 (a difference between the maximum value and the minimum value) of the storage amounts QB1 to QB5 is about 3% in SOC terms. On the other hand, the comparative example exhibits that a maximum difference GB2 (a difference between the maximum value and the minimum value) of the storage amounts QB11 to QB15 is about 9% in SOC terms, which is a larger variation than in the second embodiment. This result also reveals that the second embodiment could detect the charging state of the secondary battery with higher accuracy than the comparative example.

Further comparing the graph related to the characteristic point C, the second embodiment exhibits that a maximum difference GC1 (a difference between the maximum value and the minimum value) of the storage amounts QC1 to QC5 is about 3% in SOC terms. On the other hand, the comparative example exhibits that a maximum difference GC2 (a difference between the maximum value and the minimum value) of the storage amounts QC11 to QC15 is about 9% in SOC terms, which is a larger variation than in the second embodiment. This result also reveals that the second embodiment could detect the charging state of the secondary battery with higher accuracy than the comparative example.

It is obvious from the above results that the secondary battery system 16 in the second embodiment can accurately detect the state of charge of the secondary batteries. This is because the secondary battery system 16 in the second embodiment is adapted to detect the state of each secondary battery 100 by use of the largely varying dV/dQ value as compared with the battery voltage V. Even in the capacity range (10% to 90% SOC) in which variation of the battery voltage V of the secondary battery 100 is very small, the state of each secondary battery 100 can be accurately detected.

Third Embodiment

In a third embodiment, firstly, a plurality of secondary batteries 100 are subjected to a deterioration test (a storage deterioration test and a cycle deterioration test) under various conditions mentioned later so that the secondary batteries 100 are deteriorated at different degrees.

(Storage Deterioration Test)

Seventy-two secondary batteries 100 are first prepared. Each secondary battery 100 is discharged with a current value of ⅓C until the battery voltage is reduced to 2.5V. This state is referred to as 0% SOC. The seventy-two secondary batteries 100 are divided into six groups (First to Sixth groups) each including twelve secondary batteries.

The twelve secondary batteries 100 of the first group are not charged to keep 0% SOC. The twelve secondary batteries 100 of the second group are charged with a current value of ⅓C up to 20% SOC. The twelve secondary batteries 100 of the third group are charged with a current value of ⅓C up to 40% SOC. The twelve secondary batteries 100 of the fourth group are charged with a current value of ⅓C up to 60% SOC. The twelve secondary batteries 100 of the fifth group are charged with a current value of ⅓C up to 80% SOC. The twelve secondary batteries 100 of the sixth group are charged with a current value of ⅓C up to 100% SOC.

In each of the first to sixth groups, the secondary batteries are further divided four each into three sets (Subgroups A, B, and C). The secondary batteries 100 of the subgroup A in each group, i.e., twenty-four secondary batteries in total, are kept in a constant-temperature bath controlled at a temperature of 0° C. for two weeks. The secondary batteries 100 of the subgroup B in each group, i.e., twenty-four secondary batteries in total, are kept in a constant-temperature bath controlled at a temperature of 30° C. for two weeks. The secondary batteries 100 of the subgroup C in each group, i.e., twenty-four secondary batteries in total, are kept in a constant-temperature bath controlled at a temperature of 60° C. for two weeks. As above, the secondary batteries 100 in different SOCs of 0%, 20%, 40%, 60%, 80%, and 100% are kept in the constant-temperature baths controlled at different temperatures 0° C., 30° C., and 60° C. for two weeks to prompt deterioration of each secondary battery.

(Cycle Deterioration Test)

Four constant-temperature baths controlled at different temperatures, −30° C., 0° C., 30° C., and 60° C. are prepared. The secondary batteries 100 are kept eight each in the baths and then each secondary battery 100 is subjected to cycle charge and discharge. To be specific, charge and discharge are carried out by two hundred cycles with a current value of 2C under the condition that a charging upper limit voltage value is 4.1V and a discharging lower limit voltage value is 2.5V. In this way, the cycle charge and discharge is performed at four different environmental temperatures to induce deterioration of each secondary battery 100.

Figure 13:
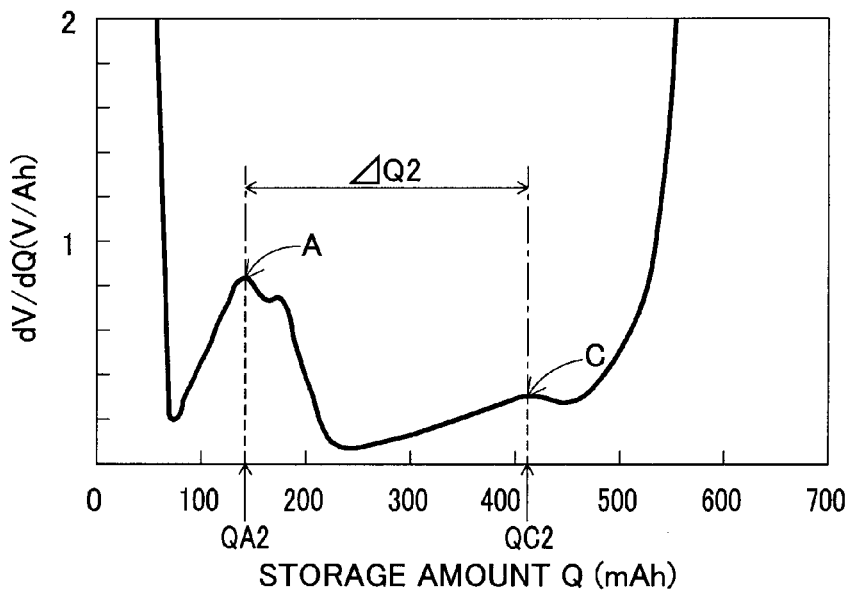
FIG. 13 is a graph showing a Q-dV/dQ curve of the secondary battery whose capacity has been decreased.

The secondary batteries 100 subjected to the above storage deterioration test or the cyclic deterioration test then undergo battery capacity (a full charging capacity) measurement in the following manner. Each secondary battery 100 is charged with a current value of ⅓C until the battery voltage reaches 4.1V. Each secondary battery 100 is continuously charged at a constant voltage of 4.1V until a current value is reduced to ⅟₁₀ of an initial value. Charging is then terminated. Subsequently, each secondary battery 100 is discharged with a current value of ⅓C until the battery voltage is reduced to 2.5V. A discharging capacity at that time is measured as a battery capacity (a full charging capacity) of each secondary battery 100. Furthermore, a Q-dV/dQ curve of each secondary battery 100 is obtained in the same manner as in the first embodiment. One of them is shown in FIG. 13.

In the above way, the battery capacity (the full charging capacity) is measured on the secondary batteries 100 remaining in an initial state without being subjected to the deterioration test. At that time, the Q-dV/dQ curve of each secondary battery 100 in the initial state is obtained in the same manner as in the first embodiment. This is shown in FIG. 14.

Furthermore, secondary batteries 100 in which micro-short circuits have occurred are prepared and then subjected to the battery capacity (full charging capacity) measurement as above. At that time, a Q-dV/dQ curve of each secondary battery 100 in the initial state is obtained in the same manner as in the first embodiment.

Herein, the Q-dV/dQ curve (see FIG. 14) of the secondary battery 100 in the initial state and the Q-dV/dQ curve (see FIG. 13) of the secondary battery 100 having decreased battery capacity (full charging capacity) by the deterioration test are compared. As is clear by comparison between the curves in FIGS. 13 and 14, three maximum points and four minimum points appear in each of the curves. A maximum point firstly appearing on a smaller battery voltage side is referred to as a characteristic point A and a maximum point thirdly appearing is referred to as a characteristic point C.

Figure 14:
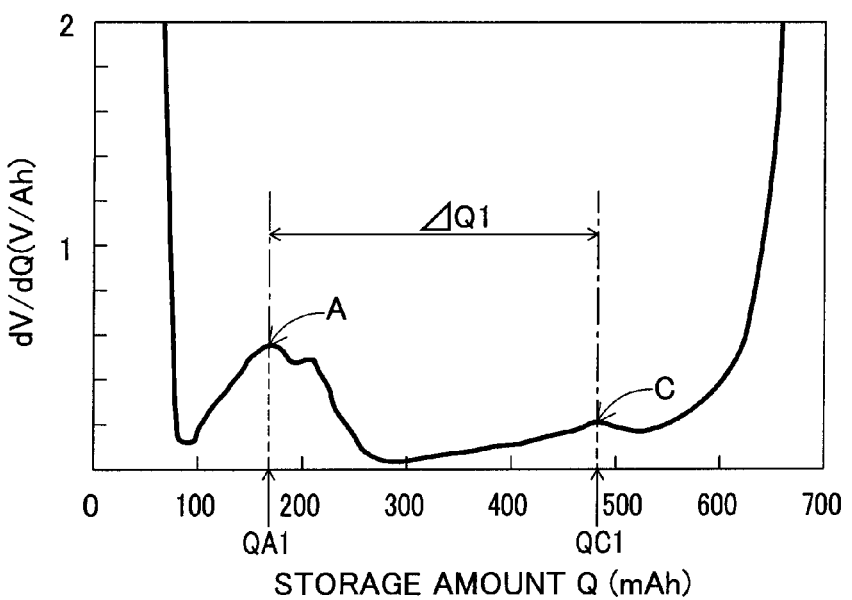
FIG. 14 is a graph showing a Q-dV/dQ curve of the secondary battery in an initial state.

In FIG. 14, firstly, a difference value $\Delta Q1$ (=QC1−QA1) between a storage amount value QA1 at the characteristic point A and a storage amount value QC1 at the characteristic point C is calculated. In FIG. 13, a difference value $\Delta Q2$ (=QC2−QA2) between a storage amount value QA2 at the characteristic point A and a storage amount value QC2 at the characteristic point C is calculated.

Comparing $\Delta Q1$ and $\Delta Q2$ reveals that $\Delta Q1 > \Delta Q2$. That is, it is found that the secondary battery 100 whose capacity has been decreased (the full charging capacity has been decreased) has a smaller difference value $\Delta Q$ between the storage amount value QA at the characteristic point A and the storage amount value QC at the characteristic point C than that of the secondary battery 100 in the initial state.

Figure 15:
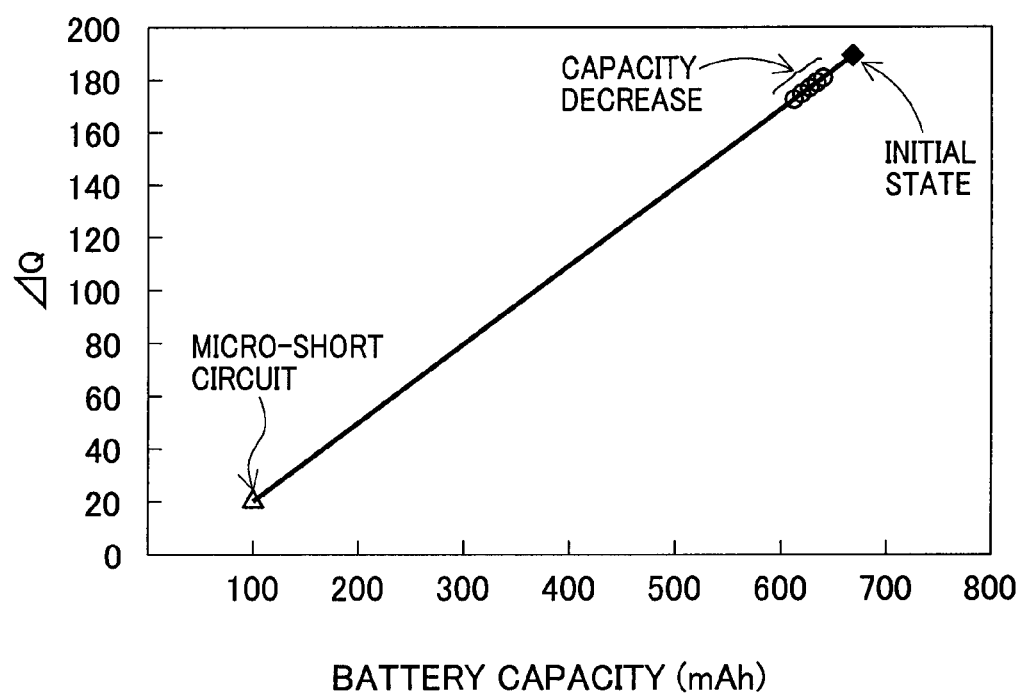
FIG. 15 is a graph showing a relationship between a battery capacity (a full charging capacity) and ΔQ.
Figure 16:
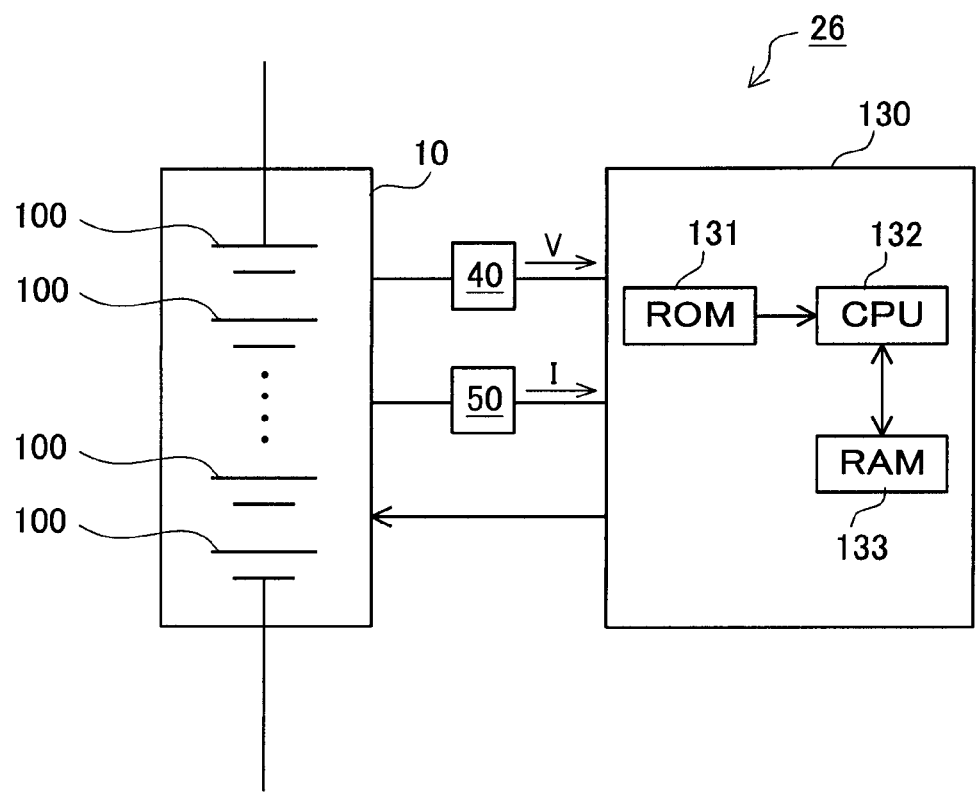
FIG. 16 is a schematic view of a secondary battery system in a third embodiment.

As above, the difference value $\Delta Q$ between the storage amount value QA at the characteristic point A and the storage amount value QC at the characteristic point C is calculated on each secondary battery 100 subjected to the deterioration test and each secondary battery 100 having micro-short circuits. This result is shown in FIG. 15 in the form of a graph representing a relationship between battery capacity (mAh) and $\Delta Q$. In FIG. 15, the secondary battery 100 in the initial state is indicated by a mark ♦, the secondary batteries 100 whose capacity has been decreased (five secondary batteries 100 selected from the secondary batteries 100 subjected to the deterioration test) are indicated by a mark ○, the secondary battery 100 having micro-short circuits is indicated by a mark △.

As seen in FIG. 15, the difference value $\Delta Q$ between the storage amount value QA at the characteristic point A and the storage amount value QC at the characteristic point C is smaller as the battery capacity (the full charging capacity) is smaller. It is also found that the difference value $\Delta Q$ of the secondary battery 100 internally having micro-short circuits is extremely small.

In the third embodiment, utilizing such characteristics, the decrease in battery capacity (full charging capacity) and the internal micro-short circuit of the secondary battery 100 are detected based on the difference value $\Delta Q$ in the Q-dV/dQ curve.

The secondary battery system in the third embodiment is identical to the secondary battery system 6 in the first embodiment excepting a battery controller. Accordingly, the following explanation is made with a focus on differences from the first embodiment and identical parts and components are not explained or are simply described.

The secondary battery system 26 in the third embodiment is provided with an assembled battery 10 including a plurality of secondary batteries 100 (cells) electrically connected in series to each other, a voltage detector 40, a current detector 50, and a battery controller 130. The battery controller 130 includes a ROM 131, a CPU 132, a RAM 133, and others.

The battery controller 130 estimates a storage amount Q of each secondary battery 100 by current integration at predetermined time intervals T in the same manner as the battery controller 30 in the first embodiment. The battery controller 130 obtains battery voltage V of each secondary battery 100 detected by the voltage detector 40 at the predetermined time intervals T in sync with the current integration. The battery controller 130 further calculates a dV/dQ value at the predetermined time intervals T in the same manner as the battery controller 30 in the first embodiment.

The ROM 131 of the battery controller 130 previously stores a Q-dV/dQ curve K (see FIG. 9) representing a relationship between a storage amount value Q and a dV/dQ value, obtained from the not deteriorated secondary battery 100 in the initial state. The ROM 31 previously stores a difference value ΔQ (referred to as a reference difference value ΔQK) between a storage amount value Q at the characteristic point A (the maximum point) (referred to as a reference characteristic value QKA) in the Q-dV/dQ curve K and a storage amount value Q at the characteristic point C (the maximum point) (referred to as a reference characteristic value QKC).

The battery controller 130 plots a Q-dV/dQ curve in real time based on the dV/dQ values calculated at the predetermined time intervals T, and determines whether or not the secondary battery 100 has reached a state corresponding to the characteristic point A or the characteristic point C in the Q-dV/dQ curve by comparison (pattern matching) with the Q-dV/dQ curve K (see FIG. 9) stored in the ROM 131.

For example, if the secondary battery 100 is determined to have reached the characteristic point A, the storage amount Q of the secondary battery 100 estimated by the battery controller 130 when the secondary battery 100 reaches the characteristic point A (referred to as an estimated characteristic value QSA) is stored. If the secondary battery 100 is determined to have reached the characteristic point C, similarly, the storage amount Q of the secondary battery 100 estimated by the battery controller 130 when the secondary battery 100 reaches the characteristic point C (referred to as an estimated characteristic value QSC) is stored. The difference value ΔQ (an actual difference value ΔQS=QSC−QSA) is calculated by subtracting the estimated characteristic value QSA from the estimated characteristic value QSC.

The battery controller 130 compares the calculated actual difference value ΔQS and the reference difference value ΔQK. If the actual difference value ΔQS is smaller than the reference difference value ΔQK, it is determined that the battery capacity of the secondary battery 100 has been decreased. In particular, if the actual difference value ΔQS is lower than 60% of the reference difference value ΔQK, it is determined that an internal micro-short circuit has occurred in the secondary battery 100. In this case, the battery controller 130 outputs a signal representing that the secondary battery 100 is abnormal, thereby indicating the necessity of replacement of the secondary battery 100.

In the third embodiment, the battery controller 130 corresponds to dV/dQ calculation means, storage amount estimating means, deterioration detecting means (capacity decrease detecting means), and abnormality detecting means (micro-short circuit detecting means).

A method of detecting the states of the secondary batteries 100 constituting the assembled battery 10 in the third embodiment will be described below. Herein, the case of charging the secondary batteries 100 is exemplified. Steps S1 to S6 are identical to those in the first embodiment and thus are not explained below.

Figure 17:
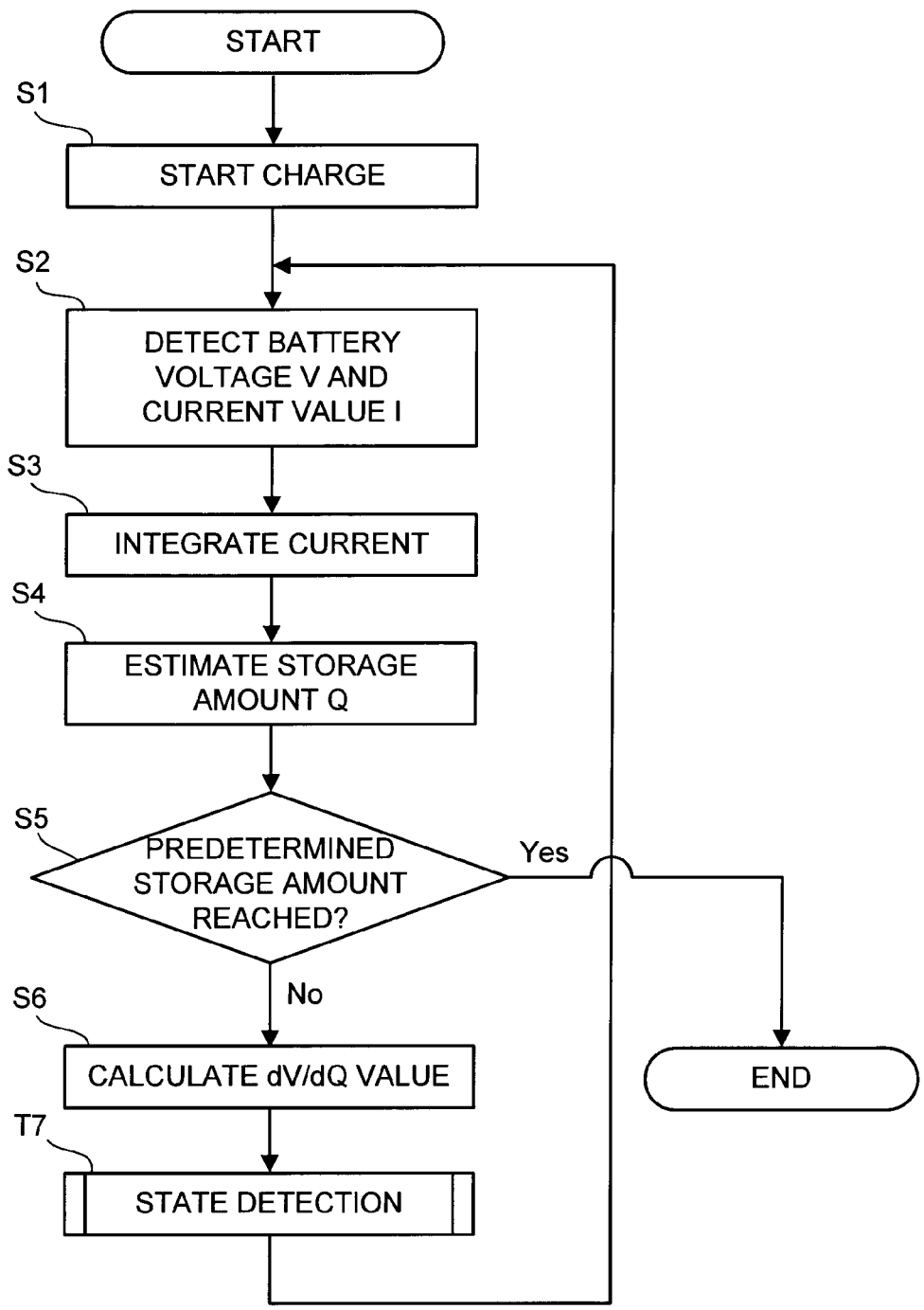
FIG. 17 is a main routine of a process of detecting a state of the secondary battery in the third embodiment.
Figure 18:
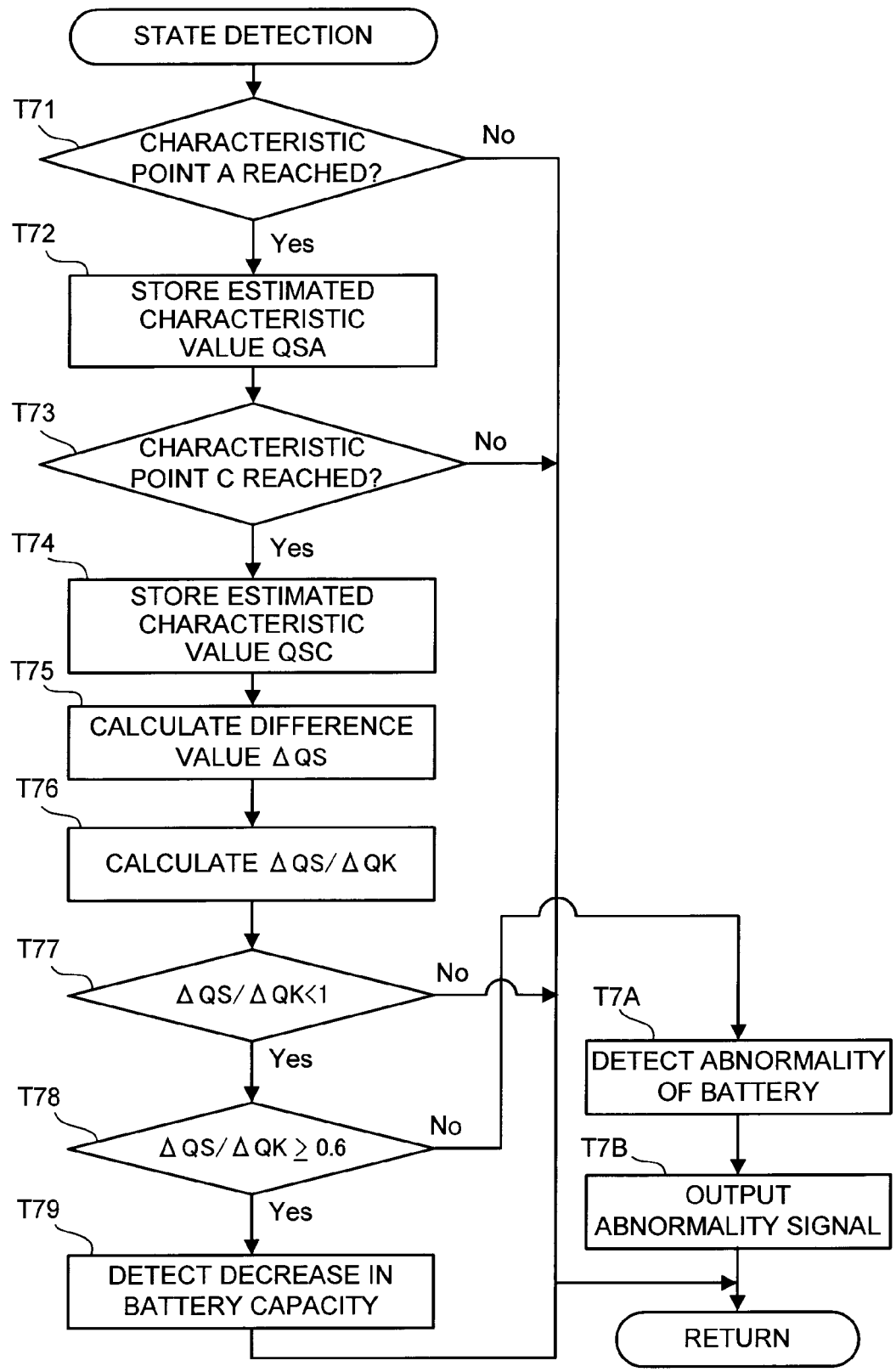
FIG. 18 is a sub-routine of the process of detecting the state of the secondary battery in the third embodiment.

As shown in FIG. 17, after the processes in steps S1 to S6, the flow advances to step T7 to detect the state of each secondary battery 100. Specifically, in a sub-routine shown in FIG. 18, it is first determined in step T71 whether or not each secondary battery 100 has reached the state corresponding to the characteristic point A in the Q-dV/dQ curve. To be specific, the battery controller 130 plots the Q-dV/dQ curve in real time based on the dV/dQ values calculated at the predetermined time intervals T, and determines whether or not each secondary battery 100 has reached the state corresponding to the characteristic point A in the Q-dV/dQ curve by comparison (pattern matching) between the above Q-dV/dQ curve and the Q-dV/dQ curve K (see FIG. 9) stored in the ROM 131.

If the secondary battery 100 is determined to have not reached the characteristic point A (No), the flow returns to the main routine shown in FIG. 17 and the processes in steps S2 to T7 are conducted again.

On the other hand, if the secondary battery 100 is determined to have reached the characteristic point A (Yes), the flow advances to step T72 in which the storage amount Q (the estimated characteristic value QSA) of the secondary battery 100 estimated by the battery controller 130 when the secondary battery 100 reaches the characteristic point A is stored.

In step T73, successively, it is determined on each secondary battery 100 whether or not it has reached the state corresponding to the characteristic point C in the Q-dV/dQ curve. To be specific, the battery controller 130 plots the Q-dV/dQ curve in real time based on the dV/dQ values calculated at the predetermined time intervals T, and determines whether or not the secondary battery 100 has reached the state corresponding to the characteristic point C in the Q-dV/dQ curve by comparison (pattern matching) between the above Q-dV/dQ curve and the Q-dV/dQ curve K (see FIG. 9) stored in the ROM 131.

If the secondary battery 100 is determined to have not reached the characteristic point C (No), the flow returns to the main routine shown in FIG. 17 and the processes in steps S2 to T7 are conducted again.

On the other hand, if the secondary battery 100 is determined to have reached the characteristic point C (Yes), the flow advances to step T74 in which the storage amount Q (the estimated characteristic value QSC) of the secondary battery 100 estimated by the battery controller 130 when the secondary battery 100 reaches the characteristic point C.

In step T75, successively, a difference value ΔQ (an actual difference value ΔQS=QSC−QSA) is calculated by subtracting the estimated characteristic value QSA from the estimated characteristic value QSC.

Then, in step T76, the calculated actual difference value ΔQS is compared with the reference difference value ΔQK stored in the ROM 131. Specifically, the actual difference value ΔQS is divided by the reference difference value ΔQK to calculate a ΔQS/ΔQK value.

In step T77, it is determined whether or not a relation of ΔQS/ΔQK<1 is satisfied. In other words, it is determined whether or not the actual difference value ΔQS is smaller than the reference difference value ΔQK. If it is determined that the relation of ΔQS/ΔQK<1 is not satisfied (No), the flow returns to the main routine shown in FIG. 17 and the processes in steps S2 to T7 are conducted again.

On the other hand, if it is determined that the relation of ΔQS/ΔQK<1 is satisfied (Yes), the flow advances to step T78 in which it is determined whether or not a relation of ΔQS/ΔQK≥0.6 is satisfied. In other words, it is determined whether or not the actual difference value ΔQS is no less than 60% of the reference difference value ΔQK.

If it is determined in step T78 that the relation of ΔQS/ΔQK≥0.6 is satisfied (Yes), the flow advances to step T79 in which it is determined that the battery capacity (the full charging capacity) of the secondary battery 100 has been decreased.

On the other hand, if it is determined that the relation of ΔQS/ΔQK≥0.6 is not satisfied (No), the flow advances to step T7A and the secondary battery 100 is determined to be abnormal. That is, it is determined that an internal micro-short circuit has occurred in the secondary battery 100. In this case, the flow advances to step T7B in which a signal representing that the secondary battery 100 is abnormal is output, thereby indicating the necessity of replacement of the secondary battery 100.

The flow then returns to the main routine shown in FIG. 17 and the processes in steps S2 to T7 are performed. Subsequently, if it is determined in step S5 that the storage amount Q has reached a predetermined storage amount (Yes), charging is terminated.

Fourth Embodiment

The secondary batteries 100 subjected to the storage deterioration test or the cyclic deterioration test in the third embodiment are then subjected to measurement of internal resistance (mil) as follows.

Firstly, each secondary battery 100 is discharged with a current value of ⅓C until battery voltage decreases to 2.5V and then is charged with a current value of ⅓C to 50% SOC. In this state, the internal resistance of each system 100 is measured by an alternating impedance method. To be specific, by using a Solatron 1252A unit as a FRA (frequency response analyzer) and a Solatron SI1287 unit as a control unit, a potential amplitude of 5 mV is given and the frequency is changed in a range of 1 MHz to 1 Hz. A value measured at the frequency of 1 kHz is referred to as an internal resistance (mΩ) of each secondary battery 100.

Figure 19:
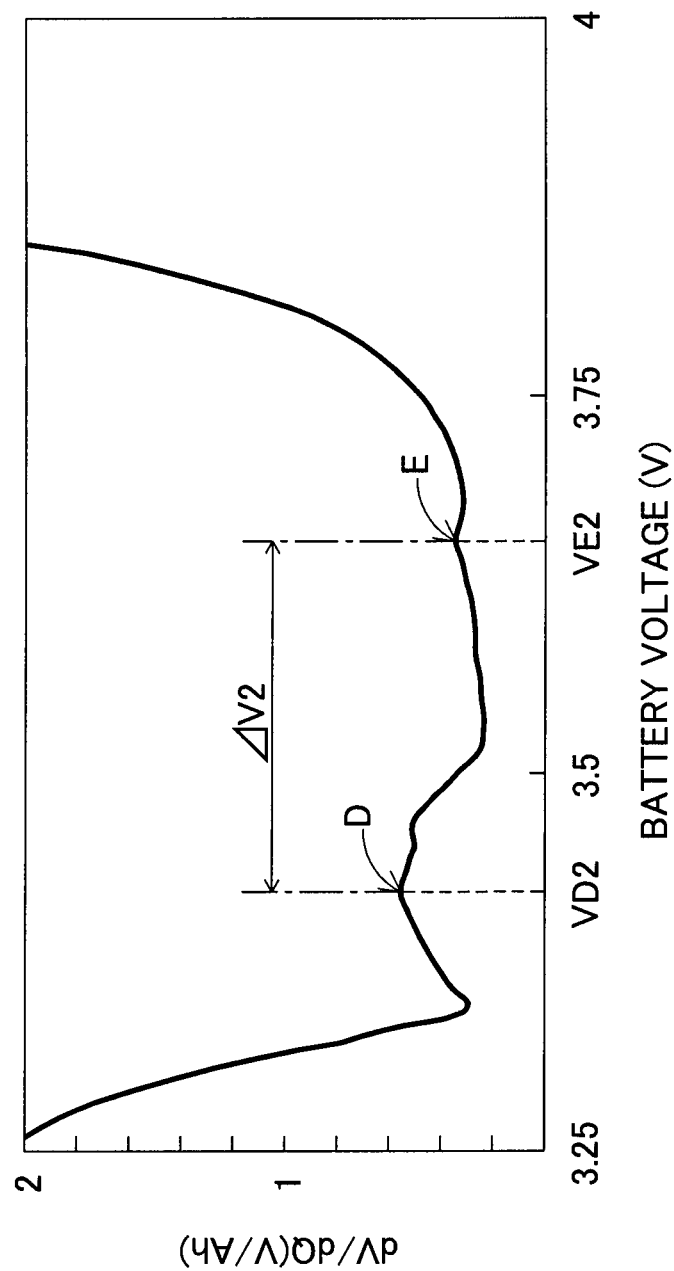
FIG. 19 is a graph showing a V-dV/dQ curve of the secondary battery whose internal resistance has been increased.
Figure 20:
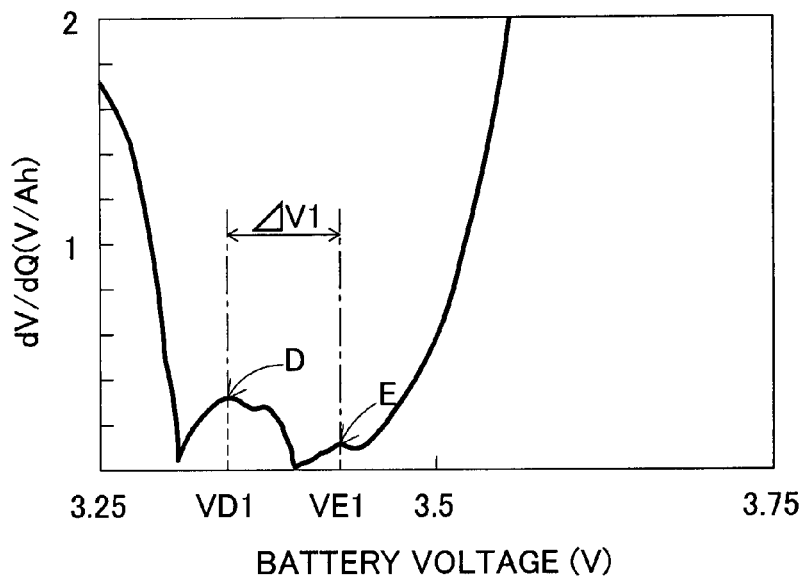
FIG. 20 is a view showing a V-dV/dQ curve of the secondary battery in an initial state.

Each secondary battery 100 subjected to the deterioration test in the third embodiment is subjected to measurement of battery capacity (full charging capacity) in the same manner as in the third embodiment. At that time, a battery controller 230 obtains a V-dV/dQ curve representing a relationship between a battery voltage value V and a dV/dQ value based on the dV/dQ values calculated at predetermined time intervals. One of them is shown in FIG. 19. A V-dV/dQ curve of the secondary battery 100 in the initial state, not subjected to the deterioration test, is also obtained. This is shown in FIG. 20.

While the secondary battery 100 in the initial state, not subjected to the deterioration test, are in a connection failure, the battery capacity (the full charging capacity) is measured in the same manner as in the third embodiment. At that time, the battery controller 230 obtains a V-dV/dQ curve based on dV/dQ values calculated at the predetermined time intervals.

Figure 25:
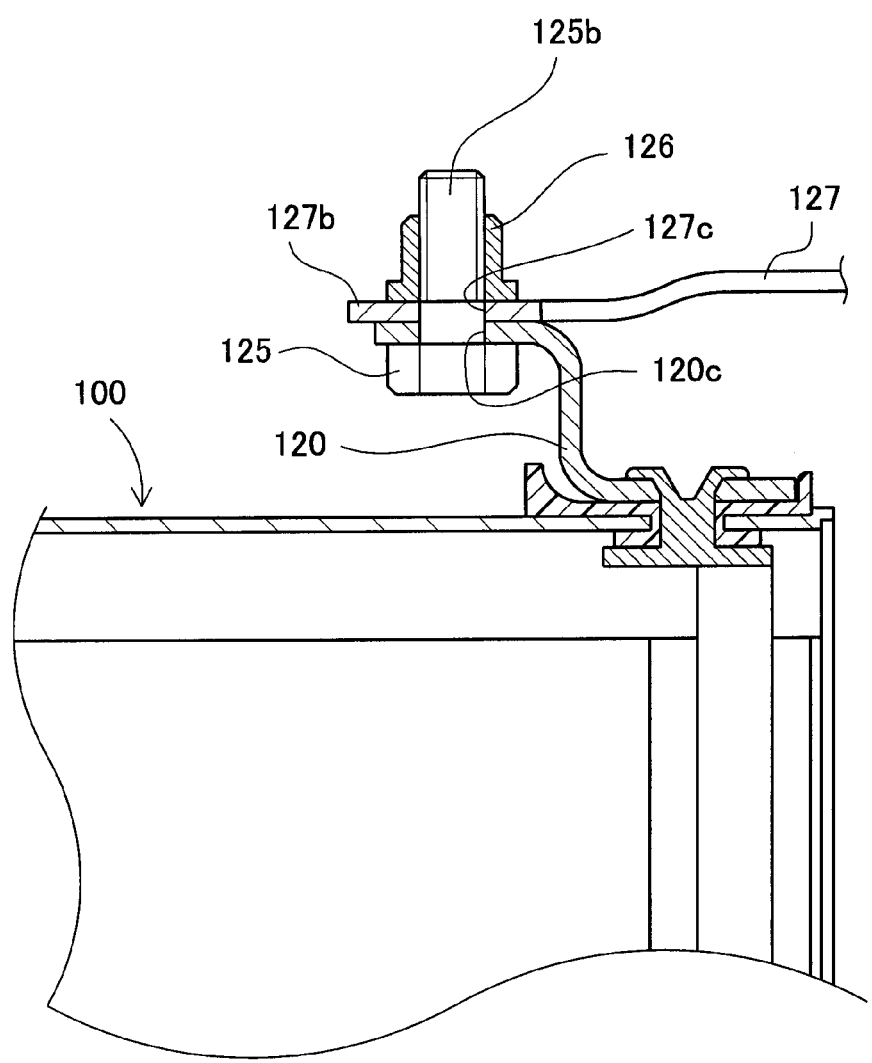
FIG. 25 is a view to explain connection between a positive terminal and a cable.

In the fourth embodiment, a cable 270 connecting a positive terminal 120 of the secondary battery 100 to the battery controller 230 and others is connected as follows. As shown in FIG. 25, a screw part 125b of a bolt 125 is inserted in a through hole 120c of the positive terminal 120 and a through hole 127c of a connection terminal 127b. In this state, a nut 126 is screwed on the screw part 125b of the bolt 125, thereby securing the positive terminal 120 to the connection terminal 127b. Thus, the positive terminal 120 and the connection terminal 127b can be appropriately connected to each other in close contact relation. In the fourth embodiment, consequently, a connection failure state is established by loosening the nut 126 so as not to place the positive terminal 120 and the connection terminal 127b in tight contact with each other.

Herein, a comparison is made between the V-dV/dQ curve (see FIG. 20) of the secondary battery 100 in the initial state and the V-dV/dQ curve (see FIG. 19) of the secondary battery 100 whose internal resistance was increased in the deterioration test. As seen by comparison between the curves in FIGS. 19 and 20, both curves have three maximum points. A maximum point firstly appearing on a smaller battery voltage side is referred to as a characteristic point D and a maximum point thirdly appearing is referred to as a characteristic point E.

In FIG. 20, a difference value ΔV1 (=VE1−VD1) between a battery voltage value VD1 at the characteristic point D and a battery voltage value VE1 at the characteristic point E is calculated. In FIG. 19, furthermore, a difference value ΔV2 (=VE2−VD2) between a battery voltage value VD2 at the characteristic point D and a battery voltage value VE2 at the characteristic point E is calculated.

Comparing ΔV1 and ΔV2, a relation of ΔV2>ΔV1 is found. Specifically, it is found that the secondary battery 100 having increased internal resistance is larger in the difference value ΔV between the battery voltage value VD at the characteristic point D and the battery voltage value VE at the characteristic point E than the secondary battery 100 in the initial state.

Figure 21:
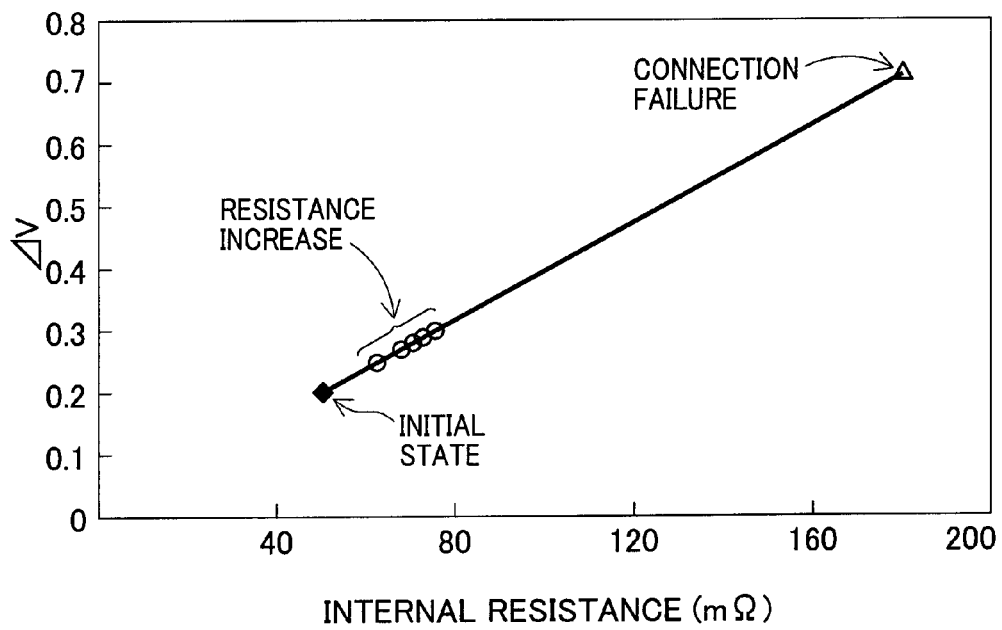
FIG. 21 is a graph showing a relationship between the internal resistance (mΩ) and ΔV.
Figure 22:
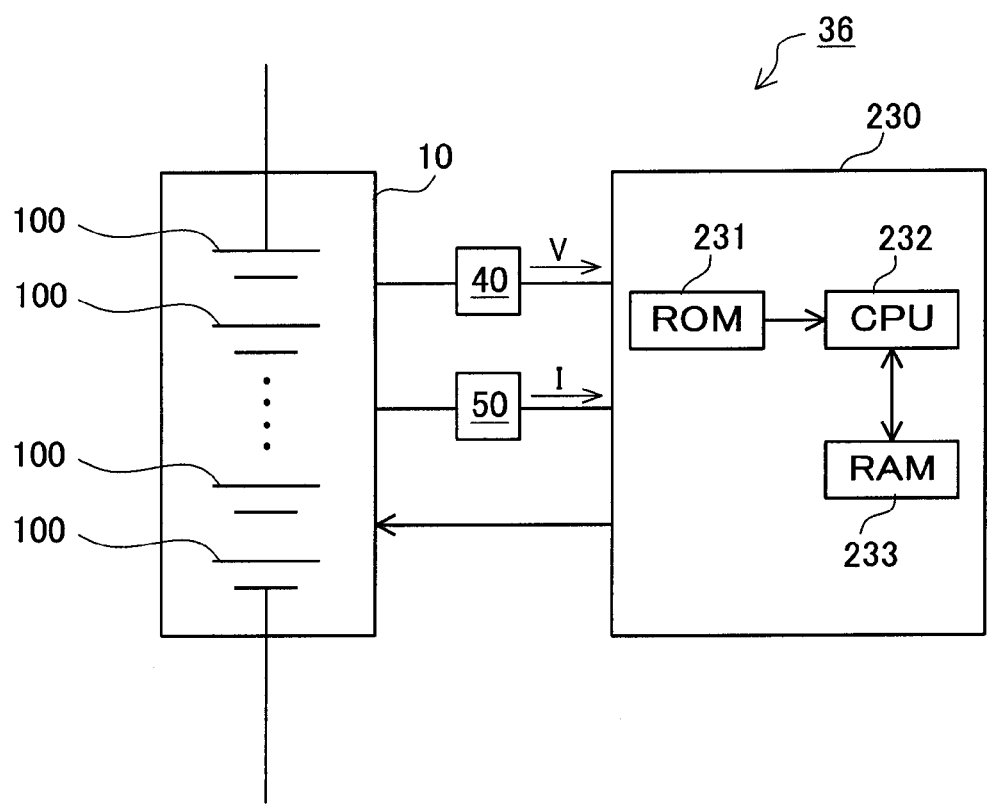
FIG. 22 is a schematic view of a secondary battery system in a fourth embodiment.

In relation to the secondary batteries 100 subjected to the deterioration test and the secondary batteries 100 placed in the connection failure state as above, a difference value ΔV between the battery voltage value VD at the characteristic point D and the battery voltage value VE at the characteristic point E is calculated. This result is shown in FIG. 21 in the form of a graph representing a relationship between the internal resistance (mAh) and ΔV. In FIG. 21, the secondary batteries 100 in the initial state are indicated by a mark ♦, the secondary batteries 100 having increased internal resistance (five secondary batteries 100 selected from the secondary batteries 100 subjected to the deterioration test) are indicated by a mark ○, the secondary batteries 100 in the connection failure state are indicated by a mark Δ.

It is found from FIG. 21 that the difference value ΔV between the battery voltage value VD at the characteristic point D and the battery voltage value VE at the characteristic point E is larger as the internal resistance of the secondary battery 100 is larger. It is also seen that the difference value ΔV of the secondary battery 100 in the connection failure state is extremely large.

In the fourth embodiment, utilizing such characteristics, the increase in internal resistance and the connection failure of the secondary battery 100 are detected based on the difference value ΔV in the V-dV/dQ curve.

The secondary battery system in the fourth embodiment is identical to the secondary battery system 6 in the first embodiment excepting a battery controller. Accordingly, the following explanation is made with a focus on differences from the first embodiment and identical parts and components are not explained or are simply described.

The secondary battery system 36 in the fourth embodiment is provided with a assembled battery 10 including a plurality of secondary batteries 100 (cells) electrically connected to each other in series, a voltage detector 40, a current detector 50, and a battery controller 230. the battery controller 230 includes a ROM 231, a CPU 232, a RAM 233, and others.

The battery controller 230 estimates a storage amount Q of each secondary battery 100 by current integration at predetermined time intervals T in the same manner as the battery controller 30 in the first embodiment. The battery controller 230 obtains battery voltage V of each secondary battery 100 detected by the voltage detector 40 at the predetermined time intervals T in sync with the current integration. The battery controller 230 further calculates a dV/dQ value at the predetermined time intervals T in the same manner as the battery controller 30 in the first embodiment.

Figure 26:
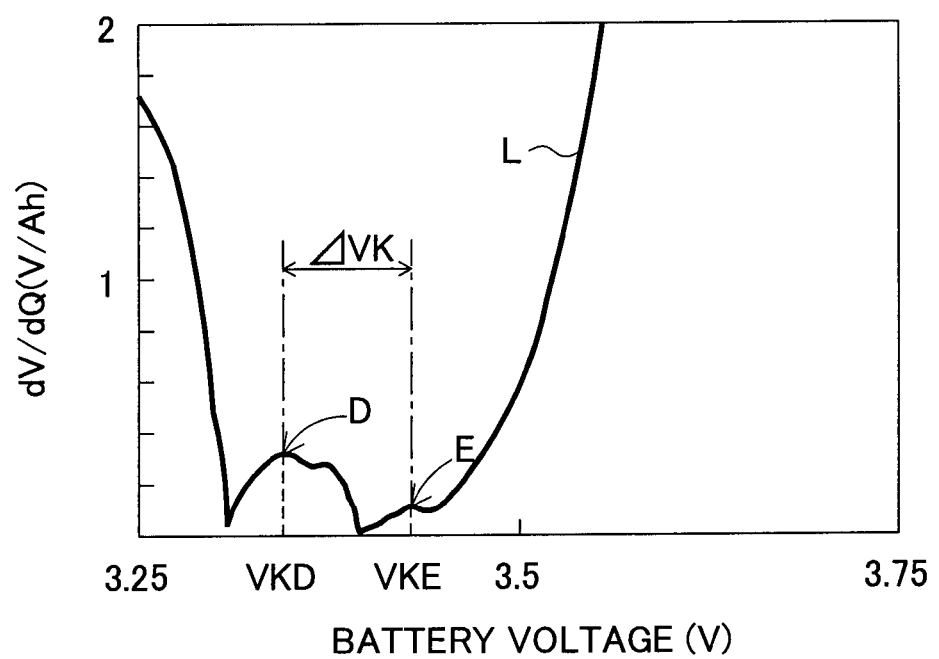
FIG. 26 is a view showing a V-dV/dQ curve of the secondary battery.

The ROM 231 of the battery controller 230 previously stores a V-dV/dQ curve L (see FIG. 26) representing a relationship between the battery voltage value V and the dV/dQ value, obtained from the secondary battery 100 in the initial state. The ROM 231 previously stores a difference value ΔV (referred to as a reference difference value ΔVK) between a battery voltage V (referred to as a reference battery voltage value VKD) at the characteristic point D in the V-dV/dQ curve and a battery voltage value V (referred to as a reference voltage value VKE) at the characteristic point E.

The battery controller 230 further plots a V-dV/dQ curve in real time based on the dV/dQ values calculated at predetermined time intervals T, and determines whether the secondary battery 100 has reached a state corresponding the characteristic point D or E in the V-dV/dQ curve by comparison (pattern matching) between this V-dV/dQ curve with the V-dV/dQ curve L (see FIG. 26) stored in the ROM 231.

For example, if the secondary battery 100 is determined to have reached the characteristic point D, the battery voltage (referred to as an actual voltage value VSD) of the secondary battery 100 detected by the voltage detector 40 when the secondary battery 100 reaches the characteristic point D is stored. If the secondary battery 100 is determined to have reached the characteristic point E, similarly, the battery voltage (referred to as an actual voltage value VSE) of the secondary battery 100 detected by the voltage detector 40 when the secondary battery 100 reaches the characteristic point E is stored. The difference value ΔV (an actual difference value ΔVS=VSE−VSD) is calculated by subtracting the actual voltage value VSD from the actual voltage value VSE.

The battery controller 230 compares the calculated actual difference value ΔVS and the reference difference value ΔVK. If the actual difference value ΔVS is larger than the reference difference value ΔVK, it is determined that the internal resistance of the secondary battery 100 has been increased. In particular, if the actual difference value ΔVS is larger than three times of the reference difference value ΔVK, the secondary battery 100 is determined to have a connection failure. In this case, the battery controller 230 outputs a signal representing that the secondary battery 100 has a connection failure, thereby indicating the necessity to check connection of the secondary battery 100.

In the fourth embodiment, the battery controller 230 corresponds to dV/dQ calculation means, storage amount estimating means, deterioration detecting means (resistance increase detecting means), and abnormality detecting means (connection failure detecting means).

A method of detecting the state of the secondary batteries 100 constituting the assembled battery 10 in the fourth embodiment will be described below. Herein, the case of charging the secondary batteries 100 is exemplified. Steps S1 to S6 are identical to those in the first embodiment and thus are not explained below.

Figure 23:
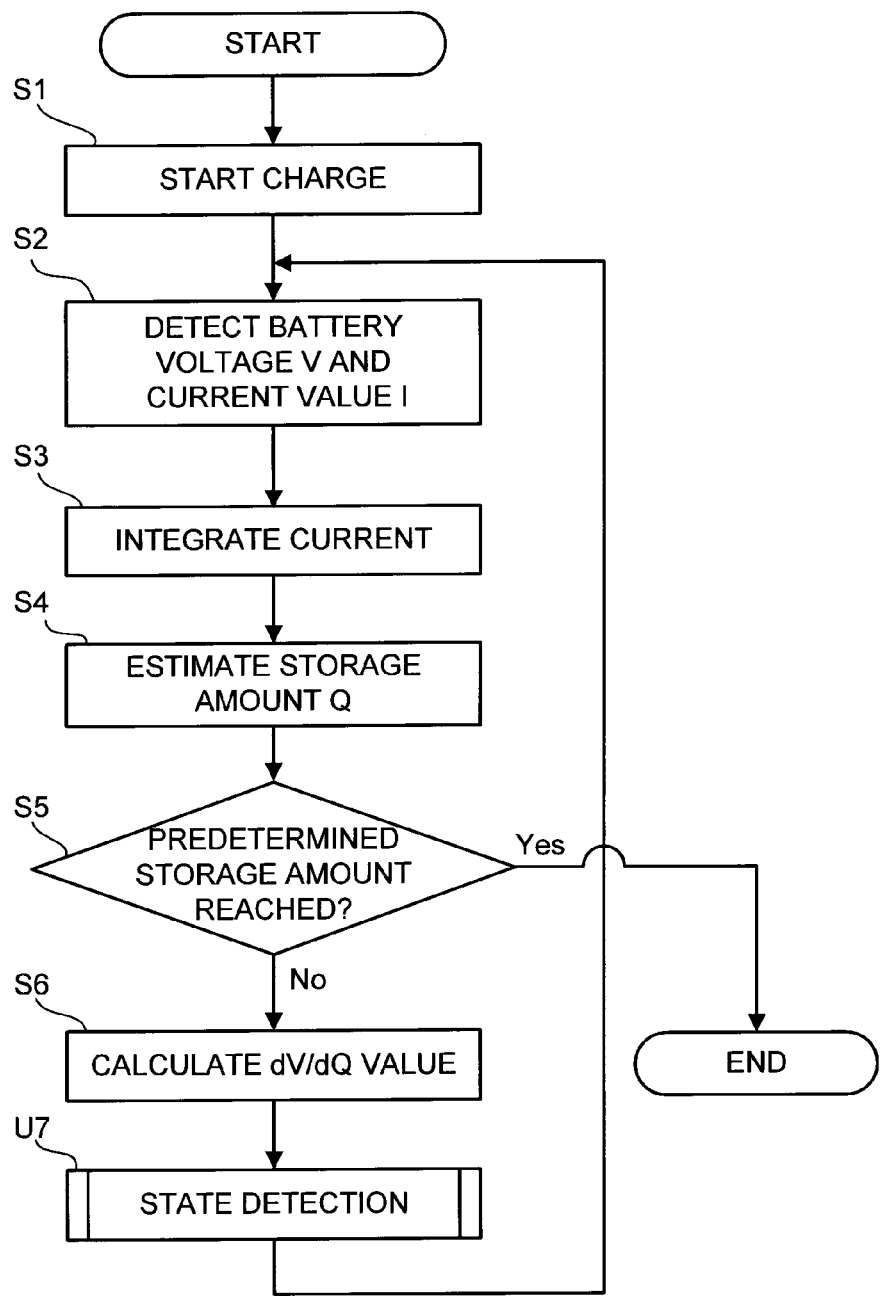
FIG. 23 is a main routine of a process of detecting a state of the secondary battery in the fourth embodiment.
Figure 24:
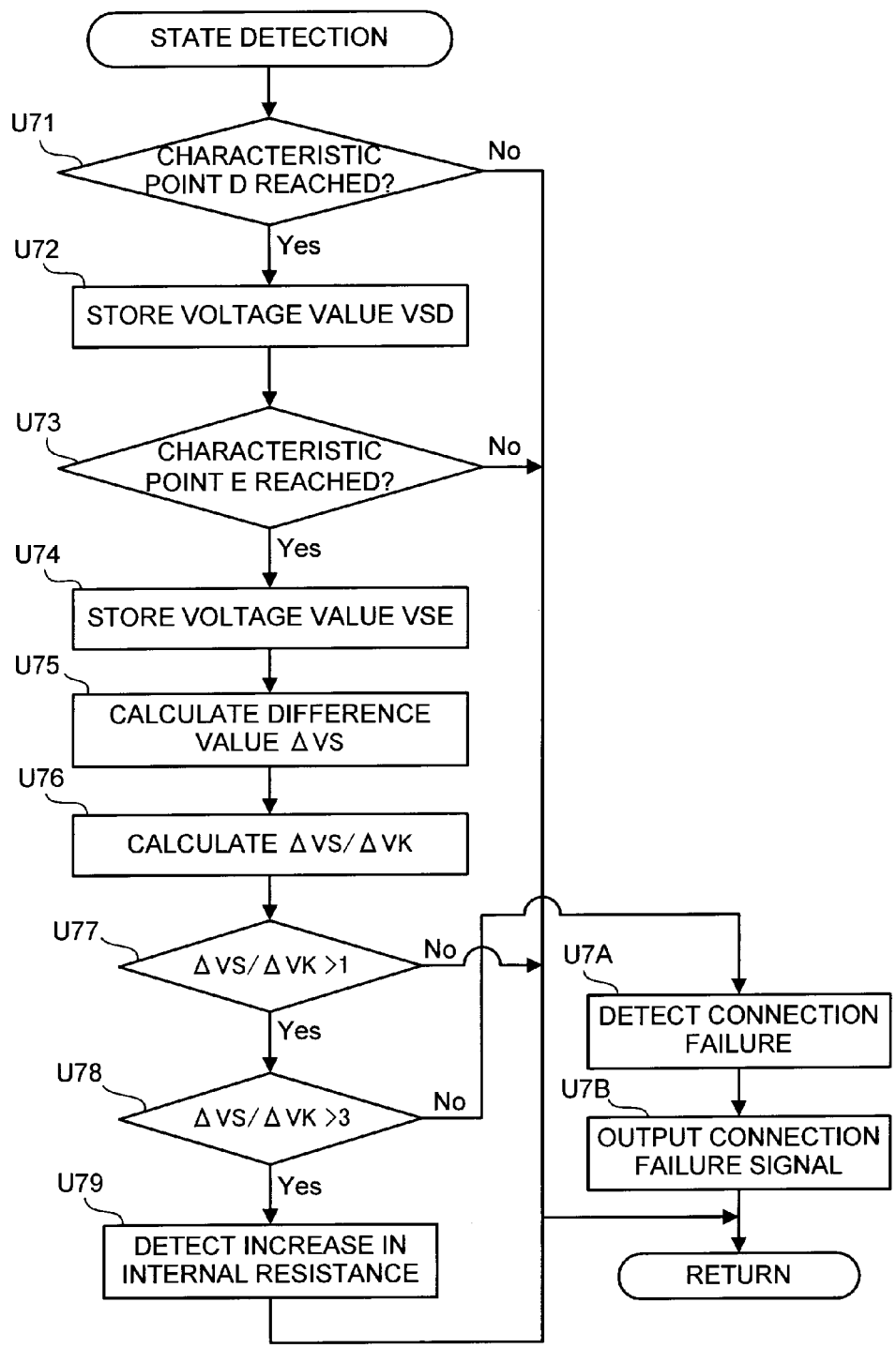
FIG. 24 is a sub-routine of the process of detecting the state of the secondary battery in the fourth embodiment.

As shown in FIG. 23, after the processes in steps S1 to S6, the flow advances to step U7 to detect the state of each secondary battery 100. In a sub-routine shown in FIG. 24, firstly, it is determined in step U71 whether or not each secondary battery 100 has reached the state corresponding to the characteristic point D in the V-dV/dQ curve. To be specific, the battery controller 230 plots a V-dV/dQ curve in real time based on the dV/dQ values calculated at the predetermined time intervals T, and determines whether or not each secondary battery 100 has reached a state corresponding to the characteristic point D in the V-dV/dQ curve by comparison (pattern matching) between the above V-dV/dQ curve and the V-dV/dQ curve L (see FIG. 26) stored in the ROM 231.

If the secondary battery 100 is determined to have not reached the characteristic point D (No), the flow returns to the main routine shown in FIG. 23 and the processes in steps S2 to U7 are performed again.

On the other hand, if the secondary battery 100 is determined to have reached the characteristic point D (Yes), the flow advances to step U72 in which a battery voltage value (an actual voltage value VSD) of each secondary battery 100 detected by the voltage detector 40 when the secondary battery 100 reaches the characteristic point D is stored.

In step U73, subsequently, it is determined whether or not each secondary battery 100 has reached the state corresponding to the characteristic point E in the V-dV/dQ curve. Specifically, the battery controller 230 plots a V-dV/dQ curve in real time based on the dV/dQ values calculated at the predetermined time intervals T, and determines whether or not the secondary battery 100 has reached the state corresponding to the characteristic point E in the V-dV/dQ curve by comparison (pattern matching) between the above V-dV/dQ curve and the V-dV/dQ curve L (see FIG. 26) stored in the ROM 231.

If the secondary battery 100 is determined to have not reached the characteristic point E (No), the flow returns to the main routine shown in FIG. 23 and the processes in steps S2 to U7 are conducted again.

If the secondary battery 100 is determined to have reached the characteristic point E (Yes), on the other hand, the flow advances to step U74 in which the battery voltage value (the actual voltage value VSE) of each secondary battery 100 detected by the voltage detector 40 when the secondary battery 100 reaches the characteristic point E is stored.

In step U75, a difference value ΔV (an actual difference value ΔVS=VSE−VSD) is calculated by subtracting the actual voltage value VSD from the actual voltage value VSE.

In step U76, subsequently, the calculated actual difference value ΔVS is compared with the reference difference value ΔVK stored in the ROM 231. To be specific, the actual difference value ΔVS is divided by the reference difference value ΔVK to calculate a ΔVS/ΔVK value.

In step U77, it is determined whether or not a relation of ΔVS/ΔVK>1 is satisfied. In other words, it is determined whether or not the actual difference value ΔVS is larger than the reference difference value ΔVK. If it is determined that the relation of ΔVS/ΔVK>1 is not satisfied (No), the flow returns to the main routine shown in FIG. 23 and the processes in steps S2 to U7 are conducted again.

If it is determined that the relation of ΔVS/ΔVK>1 is satisfied (Yes), the flow advances to step U78 in which it is determined whether or not a relation of ΔVS/ΔVK>3 is satisfied. In other words, it is determined whether or not the actual difference value ΔVS is larger than three times of the reference difference value ΔVK.

If it is determined in step U78 that the relation of ΔVS/ΔVK>3 is not satisfied (No), the flow advances to step U79 in which it is determined that the internal resistance of the secondary battery 100 has increased.

If it is determined that the relation of ΔVS/ΔVK>3 is satisfied (Yes), the flow advances to step U7A in which the secondary battery 100 is determined to have the connection failure. In this case, in step U7B, a signal representing that the connection failure of the secondary battery 100 has occurred is output, thereby indicating the necessity to check the connection of the secondary battery 100.

Subsequently, the flow returns to the main routine shown in FIG. 23 and the processes in steps S2 to U7 are performed. If it is determined in step S5 that the storage amount Q has reached the predetermined storage amount (Yes), charging is terminated.

The present invention is explained in the above first to fourth embodiments but not limited thereto. The present invention may be embodied in other specific forms without departing from the essential characteristics thereof.

For instance, the third embodiment describes the method of detecting the states of the secondary batteries 100 by exemplifying the case of charging the secondary batteries 100 constituting the assembled battery 10. As an alternative, the state detecting method in the third embodiment may also be applied to the case of discharging the secondary batteries 100 by changing a part of the routines shown in FIGS. 17 and 18.

To be specific, discharging of the secondary batteries 100 is started in step S1 of the main routine in FIG. 17 and then the processes in steps S2 to S6 are performed in the same manner as in the third embodiment. The flow advances to step T7 and, in the sub-routine shown in FIG. 18, the processes in steps T73 and T74 are firstly performed and the processes in steps T71 and T72 are conducted. Subsequently, as with the third embodiment, the processes in steps T75 to T7B are performed, so that a decrease in battery capacity and abnormality (internal micro-short circuit) of the secondary battery 100 can be appropriately detected.

The fourth embodiment also describes the method of detecting the states of the secondary batteries 100 by exemplifying the case of charging the secondary batteries 100 constituting the assembled battery 10. As an alternative, the state detecting method in the fourth embodiment may also be applied to the case of discharging the secondary batteries 100 by changing a part of the routines in FIGS. 23 and 24.

To be specific, discharging of the secondary batteries 100 is started in step S1 in the main routine shown in FIG. 23 and the processes in steps S2 to S6 are performed in the same manner as the fourth embodiment. The flow advances to step U7 and, in the sub-routine shown in FIG. 18, the processes in steps U73 and U74 are performed and then the processes in steps U71 and U72 are conducted. Subsequently, as with the fourth embodiment, the processes in steps U75 to U7B are performed, so that the increase in internal resistance and the connection failure of the secondary battery(s) 100 can be appropriately detected.

The invention claimed is:

1. A secondary battery system including a secondary battery,
   wherein the secondary battery includes an electrode body having a first electrode plate, a second electrode plate, and a separator,
   the first electrode plate including a first active material that makes a phase change by charge and discharge, and
   the second electrode plate including a second active material that performs two-phase coexistence type charge and discharge,
   the secondary battery system comprising: dV/dQ calculation means for calculating a dV/dQ value that is a ratio of a change amount dV of a battery voltage V of the secondary battery with respect to a change amount dQ of a storage amount Q of the secondary battery when the storage amount Q is changed during charge and discharge of the secondary battery,
   wherein a state of the secondary battery system is detected by use of a characteristic point appearing in a Q-dV/dQ curve representing a relationship between the storage amount value Q and the dV/dQ value or a characteristic point appearing in a V-dV/dQ curve representing a relationship between the battery voltage value V and the dV/dQ value, and
   the characteristic point is a maximum point, a minimum point, or an inflection point.

2. The secondary battery system according to claim 1, wherein
   the secondary battery system determines, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve, and
   the secondary battery system detects the state of the secondary battery system based on the storage amount value Q at the characteristic point in the Q-dV/dQ curve, a difference value of the storage amount Q between two specific characteristic points selected from a plurality of characteristic points appearing in the Q-dV/dQ curve, or a difference value of the battery voltage V between two specific characteristic points selected from a plurality of characteristic points appearing in the V-dV/dQ curve.

3. The secondary battery system according to claim 1, wherein
   the second active material is LiFe(1−X) MXPO4 (M is at least one of Mn, Cr, Co, Cu, Ni, V, Mo, Ti, Zn, Al, Ga, Mg, B, Nb, and 0≤X≤0.5), and
   the first active material is a carbon material.

4. The secondary battery system according to claim 1, further comprising:
   storage amount estimating means for estimating a storage amount Q of the secondary battery;
   determining means for determining, based on the dV/dQ value, whether or not the secondary battery has reached the state corresponding to the characteristic point appearing in the Q-dV/dQ curve; and
   storage amount correcting means for correcting the estimated storage amount Q,
   the storage amount correcting means corrects the estimated storage amount Q by a difference value obtained by subtracting an estimated characteristic value that is a storage amount value Q of the secondary battery estimated by the storage amount estimating means when the determining means determines that the secondary battery has reached the state corresponding to the characteristic point from a reference characteristic value that is a storage amount value Q at the characteristic point stored in advance in the secondary battery system.

5. The secondary battery system according to claim 1, further comprising:
   deterioration detecting means for detecting deterioration of the secondary battery; and,
   determining means for determining, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve, and
   the deterioration detecting means determines that the secondary battery has been deteriorated when the difference value of the storage amount Q between the two specific characteristic points selected from a plurality of characteristic points appearing in the Q-dV/dQ curve determined by the determining means is smaller than a previously set reference difference value or when the difference value of the battery voltage V between the two specific characteristic points selected from a plurality of characteristic points appearing in the V-dV/dQ curve determined by the determining means is larger than a previously set reference difference value.

6. The secondary battery system according to claim 5, wherein
the secondary battery system comprises the determining means for determining, based on the dV/dQ value, whether or not the secondary battery reached the state corresponding to the characteristic point appearing in the Q-dV/dQ curve,
the deterioration detecting means includes capacity decrease detecting means for detecting a decrease in battery capacity of the secondary battery,
the capacity decrease detecting means compares the reference difference value
of the secondary battery in an initial state, the reference difference value being a difference value of the storage amount Q between the two characteristic points in the Q dV/dQ curve and being stored in advance in the secondary battery system with an actual difference value that is a difference value of the storage amount Q between the two characteristic points in the Q-dV/dQ curve determined by the determining means, and determines that the battery capacity of the secondary battery has been decreased when the actual difference value is smaller than the reference difference value.

7. The secondary battery system according to claim 5, wherein
the secondary battery system comprises the determining means for determining, based on the dV/dQ value, whether or not the secondary battery has reached the state corresponding to the characteristic point appearing in the V-dV/dQ curve,
the deterioration detecting means includes resistance increase detecting means for detecting an increase in internal resistance of the secondary battery,
the resistance increase detecting means compares a reference difference value of the secondary battery in an initial state, the reference difference value being a difference value of the battery voltage V between the two characteristic points in the V-dV/dQ curve and being stored in advance in the secondary battery system with an actual difference value that is a difference value of the battery voltage V between the two characteristic points in the V-dV/dQ curve determined by the determining means, and determines that the internal resistance of the secondary battery has been increased when the actual difference value is larger than the reference difference value.

8. The secondary battery system according to claim 1, further comprising:
abnormality detecting means for detecting abnormality of the secondary battery system; and
determining means for determining, based on the dV/dQ value, at least one of whether or not the secondary battery has reached a state corresponding to the characteristic point in the Q-dV/dQ curve and whether or not the secondary battery has reached a state corresponding to the characteristic point in the V-dV/dQ curve,
the abnormality detecting means determines that the secondary battery system is abnormal when the difference value of the storage amount Q between two specific characteristic points selected from a plurality of characteristic points appearing in the Q dV/dQ curve determined by the determining means is smaller than a previously set reference difference value and smaller than a predetermined threshold, or when the difference value of the battery voltage V between two specific characteristic points selected from a plurality of characteristic points appearing in the V-dV/dQ curve determined by the determining means is larger than a previously set reference difference value and larger than a predetermined threshold.

9. The secondary battery system according to claim 8, wherein
the secondary battery system comprises the determining means for determining, based on the dV/dQ value, whether or not the secondary battery has reached the state corresponding to the characteristic point appearing in the Q-dV/dQ curve, the abnormality detecting means includes micro-short circuit detecting means for detecting a micro-short circuit of the secondary battery,
the micro-short circuit detecting means compares the reference difference value of the secondary battery in an initial state, the reference difference value being a difference value of the storage amount Q between the two characteristic points in the Q dV/dQ curve and being stored in advance in the secondary battery system with an actual difference value that is a difference value of the storage amount Q between the two characteristic points in the Q-dV/dQ curve determined by the determining means, and determines that a micro-short circuit has occurred in the secondary battery when the actual difference value is smaller than the reference difference value and smaller than the predetermined threshold.

10. The secondary battery system according to claim 8, wherein
the secondary battery system comprises the determining means for determining, based on the dV/dQ value, whether or not the secondary battery has reached the state corresponding to the characteristic point appearing in the V-dV/dQ curve,
the abnormality detecting means includes connection failure detecting means for detecting connection failure of the secondary battery,
the connection failure detecting means compares a reference difference value of the secondary battery in an initial state, the reference difference value being a difference value of the battery voltage V between the two characteristic points in the V dV/dQ curve and being stored in advance in the secondary battery system with an actual difference value that is a difference value of the battery voltage V between the two characteristic points in the V-dV/dQ curve determined by the determining means, and determines that a connection failure of the secondary battery has occurred when the actual difference value is larger than the reference difference value and larger than the predetermined threshold.

11. The secondary battery system according to claim 6, wherein
the secondary battery system comprises the determining means for determining, based on the dV/dQ value, whether or not the secondary battery has reached the state corresponding to the characteristic point appearing in the V-dV/dQ curve,
the deterioration detecting means includes resistance increase detecting means for detecting an increase in internal resistance of the secondary battery,
the resistance increase detecting means compares a reference difference value of the secondary battery in an initial state, the reference difference value being a difference value of the battery voltage V between the two characteristic points in the V-dV/dQ curve and being stored in advance in the secondary battery system with an actual difference value that is a difference value of the battery voltage V between the two characteristic points in the V-dV/dQ curve determined by the determining means, and determines that the internal resistance of the secondary battery has been increased when the actual difference value is larger than the reference difference value.

12. The secondary battery system according to claim 9, wherein the secondary battery system comprises the determining means for determining, based on the dV/dQ value, whether or not the secondary battery has reached the state corresponding to the characteristic point appearing in the V-dV/dQ curve, the abnormality detecting means includes connection failure detecting means for detecting connection failure of the secondary battery, the connection failure detecting means compares a reference difference value of the secondary battery in an initial state, the reference difference value being a difference value of the battery voltage V between the two characteristic points in the V-dV/dQ curve and being stored in advance in the secondary battery system with an actual difference value that is a difference value of the battery voltage V between the two characteristic points in the V-dV/dQ curve determined by the determining means, and determines that a connection failure of the secondary battery has occurred when the actual difference value is larger than the reference difference value and larger than the predetermined threshold.

* * * * *